United States Patent [19]
Araya et al.

[11] Patent Number: 5,557,220
[45] Date of Patent: Sep. 17, 1996

[54] POLARITY DETECTOR

[75] Inventors: Yukihiro Araya; Takehiko Umeyama, both of Itami, Japan

[73] Assignee: Mitsubishi Denki Kabushiki Kaisha, Tokyo, Japan

[21] Appl. No.: 271,970

[22] Filed: Jul. 8, 1994

[30] Foreign Application Priority Data

Aug. 19, 1993 [JP] Japan .................. 5-205131

[51] Int. Cl.⁶ .................. G01R 19/14; G01R 19/165
[52] U.S. Cl. .................. 327/28; 327/74; 327/103
[58] Field of Search .................. 327/103, 28, 29, 327/30, 78, 77, 355, 361, 74

[56] References Cited

U.S. PATENT DOCUMENTS

| | | | |
|---|---|---|---|
| 4,539,491 | 9/1985 | Nishioka et al. | 327/103 |
| 4,859,872 | 8/1989 | Hyakutake | 327/28 |
| 5,097,147 | 3/1992 | Stuebing et al. | 327/78 |
| 5,191,235 | 3/1993 | Hara | 327/77 |
| 5,289,166 | 2/1994 | Cohen | 327/78 |
| 5,319,265 | 6/1994 | Lim | 327/77 |

*Primary Examiner*—Timothy P. Callahan
*Assistant Examiner*—Terry L. Englund
*Attorney, Agent, or Firm*—Oblon, Spivak, McClelland, Maier, & Neustadt, P.C.

[57] ABSTRACT

A polarity detector wherein voltage-to-current converters (21, 22) connected to transmission paths (1, 2) output currents according to potentials at the transmission paths (1, 2), respectively, and a current adder (23) adds the currents together. A current-to-voltage converter (24) converts the added current into the voltage (14). And comparators, whose offset voltage is less than 0 V (for example, −5 V) or more than 0 V (for example, 5 V) compare the output voltage (14) with a reference voltage to output signals indicative of whether the output voltage (14) is within a predetermined range, or more than the upper limit of the predetermined range, or less than the lower limit of the predetermined range. The polarity detector for discriminating the polarity of the plurality of transmission paths supplying signals and DC voltages is thus integrated, thereby reducing parts thereof.

28 Claims, 13 Drawing Sheets

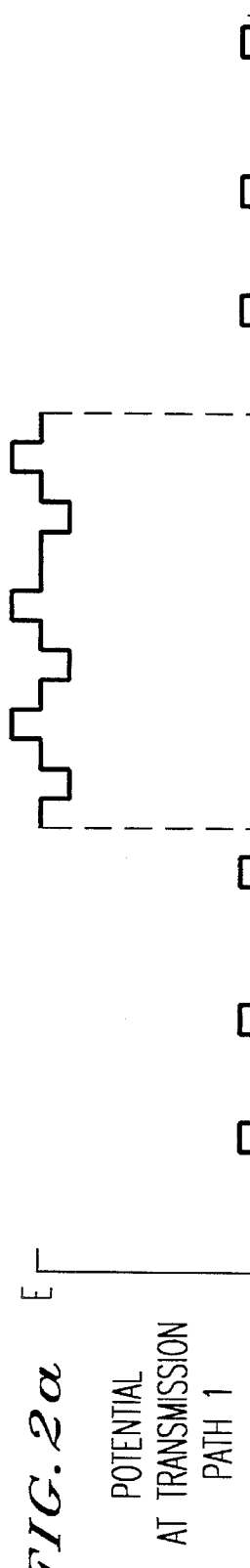
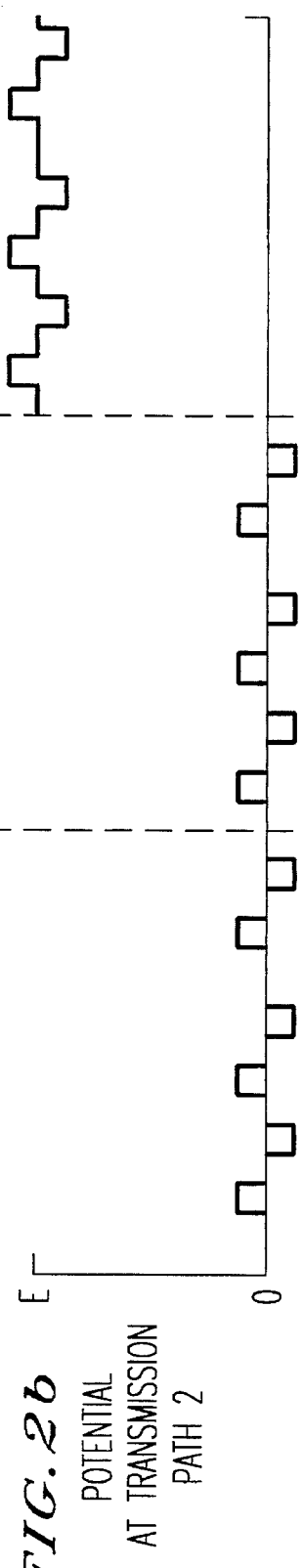
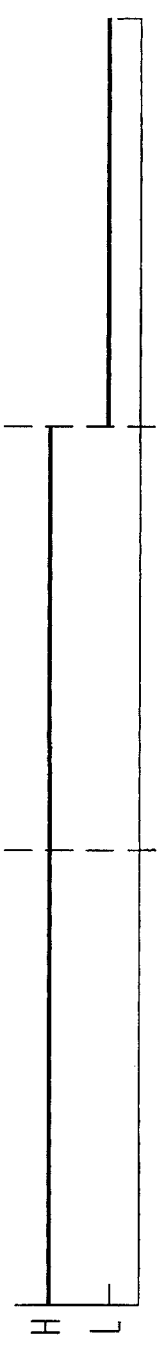
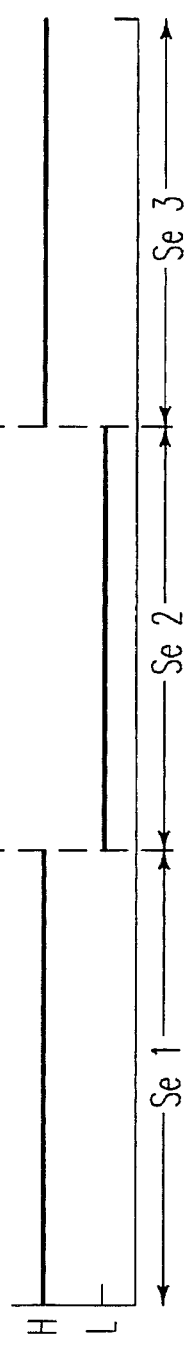
FIG. 2a POTENTIAL AT TRANSMISSION PATH 1
FIG. 2b POTENTIAL AT TRANSMISSION PATH 2
FIG. 2c OUTPUT OF COMPARATOR 6
FIG. 2d OUTPUT OF COMPARATOR 7

POTENTIAL AT TRANSMISSION PATH 51

POTENTIAL AT TRANSMISSION PATH 52

POTENTIAL DIFFERENCE BETWEEN TRANSMISSION PATHS 51 AND 52 ON BASIS OF PATH 52

POLARITY DETECTOR

BACKGROUND OF THE INVENTION

1. Field of the Invention

The present invention relates to a polarity detector for detecting the polarity of a DC voltage between transmission paths and, more particularly, to a polarity detector for detecting the polarity of a DC voltage by the transmission paths which transmit signals.

2. Description of the Background Art

FIG. 10 is a block diagram showing transmission paths such as home buses and equipments connected to the transmission paths. In FIG. 10, the reference characters $50_1$ to $50_n$ designate equipments having various functions and placed in operation on receipt of a DC voltage; and 51, 52 designate transmission paths connected to the equipments $50_1$ to $50_n$ for supplying the DC voltage to the equipments $50_1$ to $50_n$ and superimposing signals between the respective equipments $50_1$ to $50_n$ upon the DC voltage to transmit the superimposed signals. The DC voltage is applied between the transmission paths 51 and 52 in addition to the signals outputted from the equipments $50_1$ to $50_n$, as shown.

Generally, the equipments $50_1$ to $50_n$ are connected to and disconnected from the transmission paths 51 and 52. The polarity of the DC voltage applied to the transmission paths 51, 52 is often indistinguishable by their appearance. For example, the DC voltage of the transmission path 51 is not always higher than that of the transmission path 52, and no DC voltage is supplied in some cases. For these reasons, the equipments $50_1$ to $50_n$ generally comprise a circuit for detecting the polarity of the DC voltage applied to the transmission paths 51, 52. The output of the circuit for polarity detection is used for transmission and reception of data in a transmitter and receiver.

The equipment $50_1$ enclosed by dotted lines of FIG. 10 is enlarged in FIG. 11. The equipment $50_1$ includes a polarity detector 60 for detecting the polarity of the transmission paths 51, 52 (for detecting which of the transmission paths 51 and 52 is at a higher potential); a transmitter 62 and a receiver 61 for data transmission to and reception from other equipments through the transmission paths 51, 52; and a power supply circuit 63 for accepting the DC voltage from the transmission paths 51, 52 through a bridge circuit.

The equipment $50_1$ can be connected arbitrarily to the transmission paths 51, 52 because the polarity detector 60 detects the polarity of the transmission paths 51, 52 and the power supply circuit 63 gets the DC voltage from the paths 51, 52. Thus the equipment $50_1$ is capable of transmission and reception of data through the transmission paths 51, 52 by means of the transmitter 62 and the receiver 61.

There is shown in FIG. 12 an exemplary circuit diagram of the conventional polarity detector 60 of FIG. 11. In FIG. 12, the reference numeral 76 designates a current-limiting resistor having a first end connected to the transmission path 52 for limiting the current flowing in the polarity detector 60; and 72, 73 designate protective diodes connected between the second end of the current-limiting resistor 76 and the transmission path 51.

The reference numeral 69 designates a diode having an anode connected to the second end of the current-limiting resistor 76; 67 designates a photocoupler including a phototransistor having an emitter grounded and an LED(Light emitting diode) having an anode connected to the cathode of the diode 69 and a cathode connected to the transmission path 51; and 74 designates a pull-up resistor having a first end connected to the collector of the phototransistor of the photocoupler 67 and a second end connected to a power supply potential $V_{cc}$.

The reference numeral 70 designates a diode having a cathode connected to the second end of the current-limiting resistor 76; 68 designates a photocoupler including a phototransistor having an emitter grounded and an LED having a cathode connected to the anode of the diode 70 and an anode connected to the transmission path 51; and 75 designates a pull-up resistor having a first end connected to the collector of the phototransistor of the photocoupler 68 and a second end connected to the power supply.

Operation of the polarity detector 60 will now be described with reference to FIG. 13. FIG. 13 shows potentials at the transmission paths 51, 52 and the potential difference therebetween.

In the state Se4 of FIG. 13, the potentials at the transmission paths 51, 52 are both 0 V upon which binary data is superimposed. Since the absolute value of the potential difference between the transmission paths 51 and 52 is neither equal to nor more than the sum of the threshold voltage of the diode 69 and the threshold voltage of the LED of the photocoupler 67, there is no current flow from the transmission path 52 to the transmission path 51 through the current-limiting resistor 76, diode 69 and photocoupler 67. Further, since the absolute value of the potential difference between the transmission paths 51 and 52 is neither equal to nor more than the sum of the threshold voltage of the diode 70 and the threshold voltage of the LED of the photocoupler 68, there is no current flow from the transmission path 51 to the transmission path 52 through the photocoupler 68, diode 70, and current-limiting resistor 76. Consequently, both signal outputs 77, 78 provide a high-level signal.

In the state Se5 wherein the voltage of the transmission path 51 is higher than that of the transmission path 52 and the absolute value of the voltage is not less than the sum of the threshold voltage of the diode 70 and the threshold voltage of the LED of the photocoupler 68, a current flows from the transmission path 51 to the transmission path 52 through the photocoupler 68, diode 70, and current-limiting resistor 76. Consequently, the signal output 78 provides a low-level signal(the ground potential). Since the voltage of the transmission path 51 is higher than that of the transmission path 52 which results in a reverse voltage with respect to the diode 69 and the LED of the photocoupler 67, no current flows from the transmission path 52 to the transmission path 51 through the current-limiting resistor 76, diode 69, and photocoupler 67. The signal output 77 provides a high-level signal(the power supply potential $V_{cc}$).

In the state Se6 wherein the voltage of the transmission path 51 is lower than that of the transmission path 52 and the absolute value of the voltage is not less than the sum of the threshold voltage of the diode 69 and the threshold voltage of the LED of the photocoupler 67, a current flows from the transmission path 52 to the transmission path 51 through the current-limiting resistor 76, diode 69, and photocoupler 67. Consequently, the signal output 77 provides a low-level signal. Since the voltage of the transmission path 52 is higher than that of the transmission path 51 which results in a reverse voltage with respect to the diode 70 and the LED of the photocoupler 68, no current flows from the transmission path 52 to the transmission path 51 through the current-limiting resistor 76, diode 70, and photocoupler 68. Consequently, the signal output 78 provides a high-level signal.

The photocoupler 67, 68 insulates the transmission paths 51, 52 from external circuits connected to the signal outputs 77, 78. The threshold voltages of the diode 70 and photocoupler 68 and the threshold voltages of the diode 69 and photodiode 67 function to provide a dead zone that prevents the signals for polarity detection outputted from the signal outputs 77, 78 from being affected by the signals superimposed upon the transmission paths 51, 52.

The conventional polarity detector in which a large number of individual parts are used such as photocouplers is large in size as well as being costly.

SUMMARY OF THE INVENTION

According to the present invention, a polarity detector comprises: a first input terminal connected to a first transmission path; a second input terminal connected to a second transmission path; a first voltage-to-current converter connected to the first input terminal for feeding a current according to a potential at the first input terminal; a second voltage-to-current converter connected to the second input terminal for feeding a current according to a potential at the second input terminal; voltage generator means receiving the currents from the first and second voltage-to-current converters for providing a voltage according to a potential difference between the first and second input terminals; and a discriminating circuit for determining whether the voltage provided by the voltage generator means is within a predetermined range, or less than the lower limit of the predetermined range, or more than the upper limit of the predetermined range to output the discrimination result.

The first voltage-to-current converter according to the present invention outputs the current according to the potential at the first transmission path to the analog adder means. Likewise, the second voltage-to-current converter outputs the current according to the potential at the second transmission path to the voltage generator means. The voltage generator means then generates the voltage according to the potential difference between the first and second transmission paths by using the currents.

The discriminating circuit determines whether the output voltage of the voltage generator means is within the predetermined range, lower than the lower limit of the predetermined range, or higher than the upper limit of the predetermined range, thereby determining whether or not the output voltage of the current-to-voltage converter means, i.e., the potential difference between the first and second transmission paths is within the range of the dead zone which should not be reflected by the discrimination result to output the output voltage.

As above described, the polarity detector of the present invention detects three states as a result of the determination of the potential difference between the first and second transmission paths: the first state wherein the potential at the first transmission path is higher; the second state wherein the potential at the second transmission path is higher; and the third state wherein the potentials at the first and second transmission paths are taken as equal.

Since the first and second voltage-to-current converters once convert the potential difference between the first and second transmission paths into currents, any potential at the first and second transmission paths may be processed.

The potentials at the first and second transmission paths on which signals are superimposed may be discriminated, with the predetermined range used as the dead zone. The first and second current-to-voltage converters, the voltage generator, and the discriminating circuit are easily integrated, thereby reducing parts of the polarity detector.

Preferably, the discriminating circuit includes: a first comparing portion having a first input receiving a reference voltage, a second input receiving the voltage provided by the voltage generator means, and an output end or making a voltage comparison between the first and second inputs under a predetermined offset voltage to output the resultant signal at the output; and a second comparing portion having a first input receiving the voltage provided by the voltage generator means, a second input receiving the reference voltage, and an output for making voltage comparison between the first and second inputs under the predetermined offset voltage to output the resultant signal at the output.

The first and second comparators make the voltage comparison between the first and second inputs by using the respective predetermined offset voltages. For example, when the predetermined offset voltages of the first and second comparators are −5 V and −5 V on the basis of the second input, respectively, the discriminating circuit outputs at the outputs of the first and second comparators a combination of signals different for the three cases: wherein the voltage difference between the first and second inputs is less than −5 V, wherein it is within the range from −5 V to 5 V, and wherein it is more than 5 V.

When the predetermined offset voltages of the first and second comparators are −5 V and 2.5 V on the basis of the second input, respectively, the discriminating circuit outputs at the outputs of the first and second comparators a combination of signals different for the three cases: wherein the voltage difference between the first and second inputs is less than −5 V, wherein it is within the range from −5 V to -2.5 V, and wherein it is more than -2.5 V.

The combination of the signals outputted from the first and second comparators enables discrimination among the cases: wherein there is no potential difference between the first and second transmission paths, wherein the potential at the first transmission path is higher, and wherein the potential at the second transmission path is higher.

Such comparators may be readily formed by using devices suitable for circuit integration such as transistors.

The offset voltages of the first and second comparators may be used as the dead zone. The discriminating circuit including such comparators is easily integrated, thereby facilitating reduction in parts of the polarity detector.

Preferably, the voltage generator means includes adder means connected to the first and second voltage-to-current converters and receiving the currents fed by the first and second voltage-to-current converters for performing addition or subtraction between the currents to output a current according to the potential difference between the first and second input terminals, and current-to-voltage converter means connected to the adder means for converting the current fed by the adder means into a voltage to output the voltage; the discriminating circuit includes a first comparing portion having a first input receiving a reference voltage, a second input receiving the voltage provided by the current-to-voltage converter means, and an output end for making voltage comparison between the first and second inputs under a predetermined offset voltage to output the resultant signal at the output, and a second comparing portion having a first input receiving the voltage provided from the current-to-voltage converter means, a second input receiving the reference voltage, and an output end for making voltage comparison between the first and second inputs under a predetermined offset voltage to output the resultant signal at the output; and the current-to-voltage converter means converts the current fed by the adder means into the voltage on the basis of the reference voltage.

The adder means adds together the currents fed by the first and second current-to-voltage converters in consideration for their directions, thereby producing the current according to the potential difference between the first and second transmission paths.

The current is converted into the voltage for comparison in the discriminating circuit. The current-to-voltage converter means converts the current fed by the adder means into the voltage on the basis of the reference voltage. The upper and lower limits of the predetermined range for comparison of the discriminating circuit are determined by the predetermined offset voltages of the first and second comparators. The current-to-voltage converter means securely changes the output voltage on the basis of the reference voltage within the range.

When the offset voltages of the first and second comparators are used as the dead zone, the current-to-voltage converter means ensures the change of the output on the basis of the dead zone, facilitating the fabrication.

According to another aspect of the present invention, a polarity detector comprises: a first input terminal connected to a first transmission path; a second input terminal connected to a second transmission path; a first voltage-to-current converter connected to the first input terminal for producing a current according to a potential at the first input terminal; a second voltage-to-current converter connected to the second input terminal for producing a current according to a potential at the second input terminal; voltage generator means receiving the currents from the first and second voltage-to-current converters for generating a voltage according to a potential difference between the first and second input terminals on the basis of a voltage intermediate a first reference voltage and a second reference voltage different from the first reference voltage; and a discriminating circuit for determining a magnitude of the relationship between the voltage produced by voltage generator means and the first and second reference voltages to output the discrimination result.

The first voltage-to-current converter of the second aspect according to the present invention outputs the current according to the potential at the first transmission path to the analog adder means. Likewise, the second voltage-to-current converter outputs the current according to the potential at the second transmission path to the voltage generator means. The voltage generator means generates the voltage according to the potential difference between the first and second transmission paths by using the currents on the basis of the voltage intermediate the first and second reference voltages.

The discriminating circuit determines the magnitude of the relationship between the output voltage of the voltage generator means and the first and second reference voltages. For example, when the first reference voltage is higher than the second reference voltage, the following three states may be discriminated: the output voltage being higher than the first reference voltage; the output voltage being within the range between the first and second reference voltages; and the output voltage being lower than the second reference voltage.

The combination of the signals outputted from the first and second comparators permits the discrimination among the cases: wherein there is no potential difference between the first and second transmission paths, wherein the potential at the first transmission path is higher; and wherein the potential at the second transmission path is higher.

Such comparators may be readily formed by using devices suitable for circuit integration such as transistors.

Since the first and second voltage-to-current converters once convert the potential difference between the first and second transmission paths into currents, any potential at the first and second transmission paths may be processed.

The potentials at the first and second transmission paths on which signals are superimposed may be discriminated, with the predetermined range used as the dead zone. The first and second current-to-voltage converters, the voltage generator, and the discriminating circuit are easily integrated, thereby reducing parts of the polarity detector.

Preferably, the first input terminal is connected to the first transmission path through first resistor means, and the second input terminal is connected to the second transmission path through second resistor means.

The first and second resistor means increase the input impedance of the polarity detector as viewed from the first and second transmission paths.

This decreases the current inputted to the polarity detector.

An object of the present invention is to reduce parts of a polarity detector by integration thereof.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates the operation of the polarity detector of FIG. 1;

DESCRIPTION OF THE PREFERRED EMBODIMENTS

Figure 1:
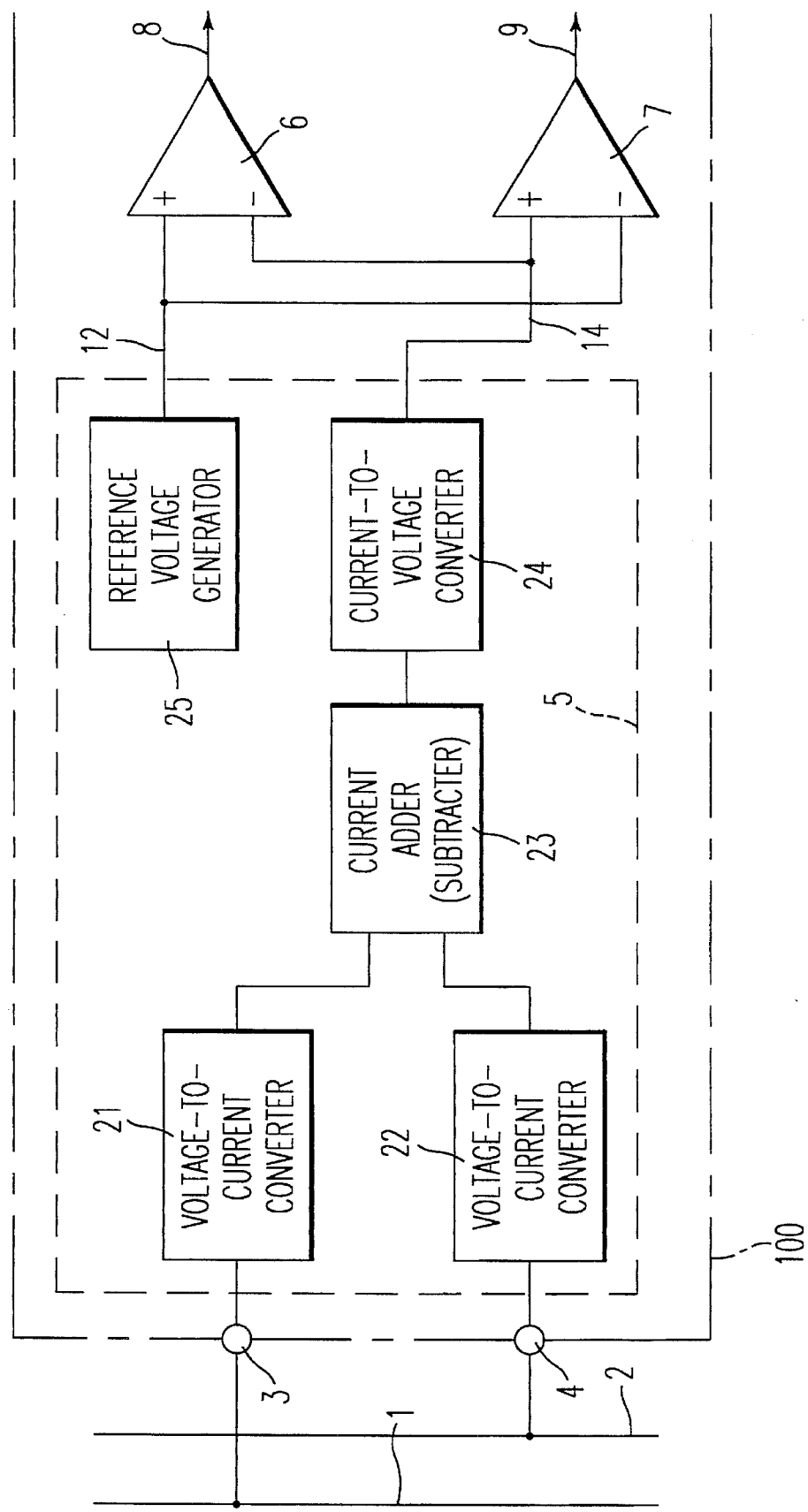
FIG. 1 is a block diagram of a polarity detector according to a first preferred embodiment of the present invention.
Figure 10:
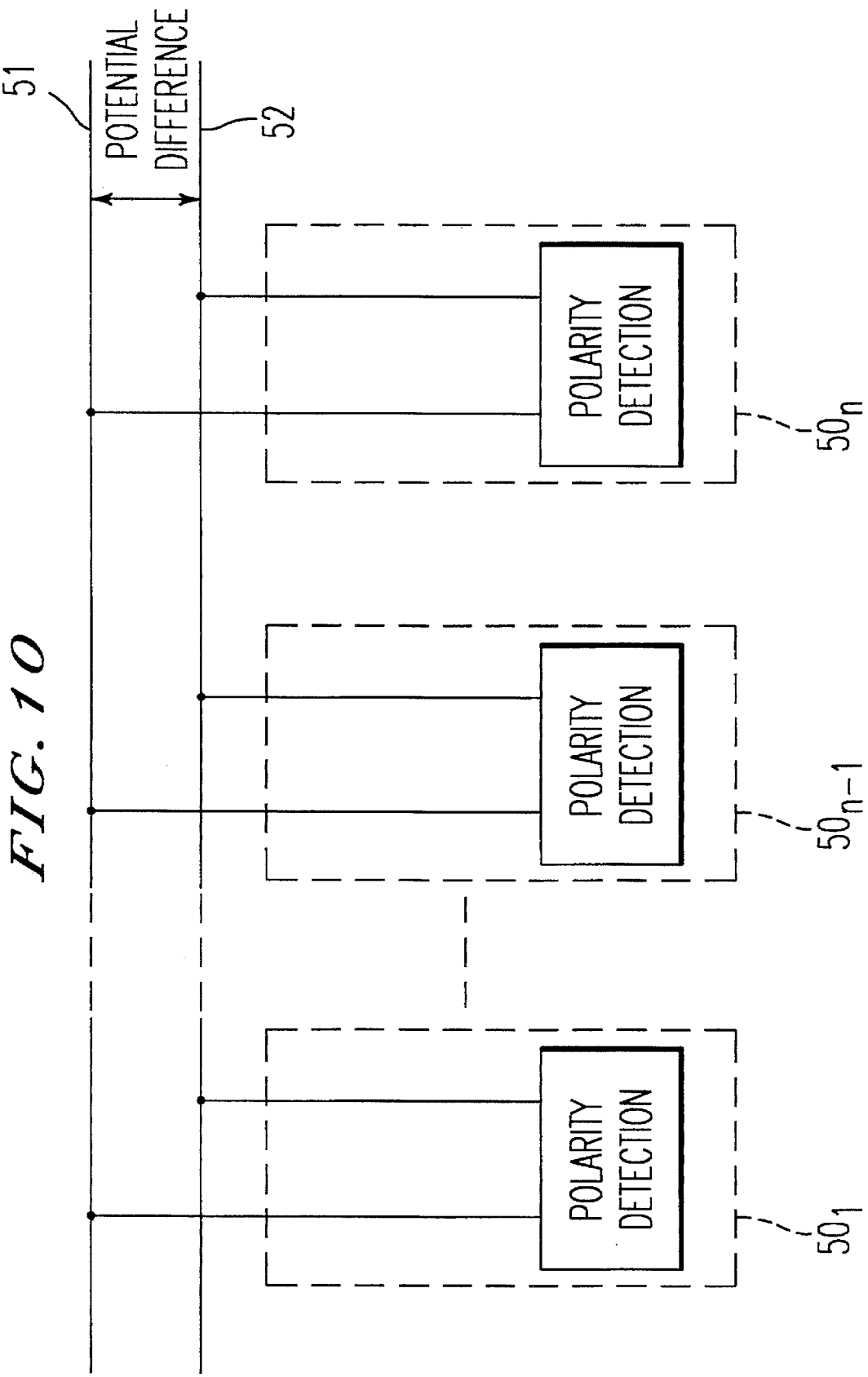
FIG. 10 is a block diagram of equipments in which the polarity detector is used.
Figure 11:
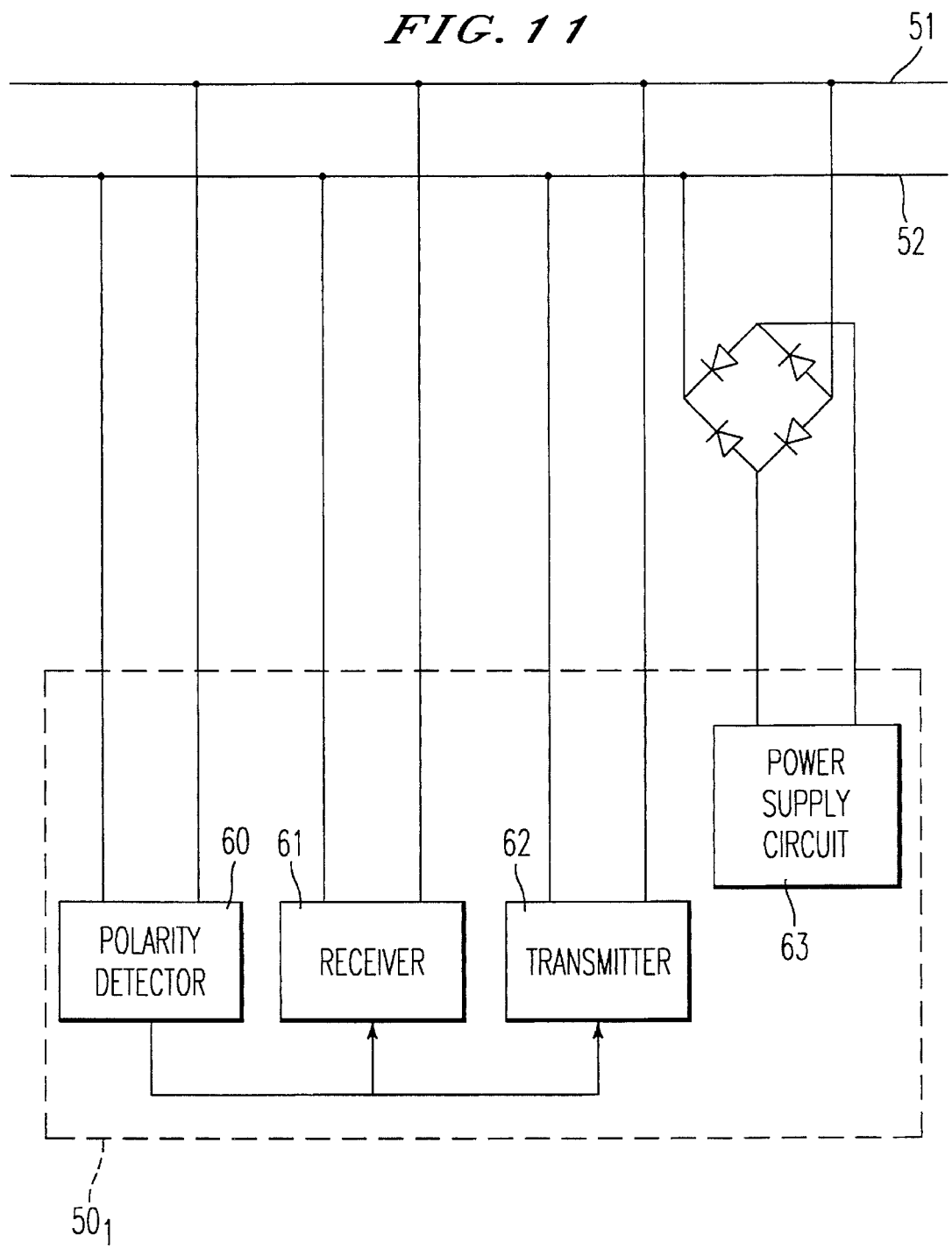
FIG. 11 is a block diagram for delineating the construction of the equipments in which the polarity detector is used.
Figure 12:
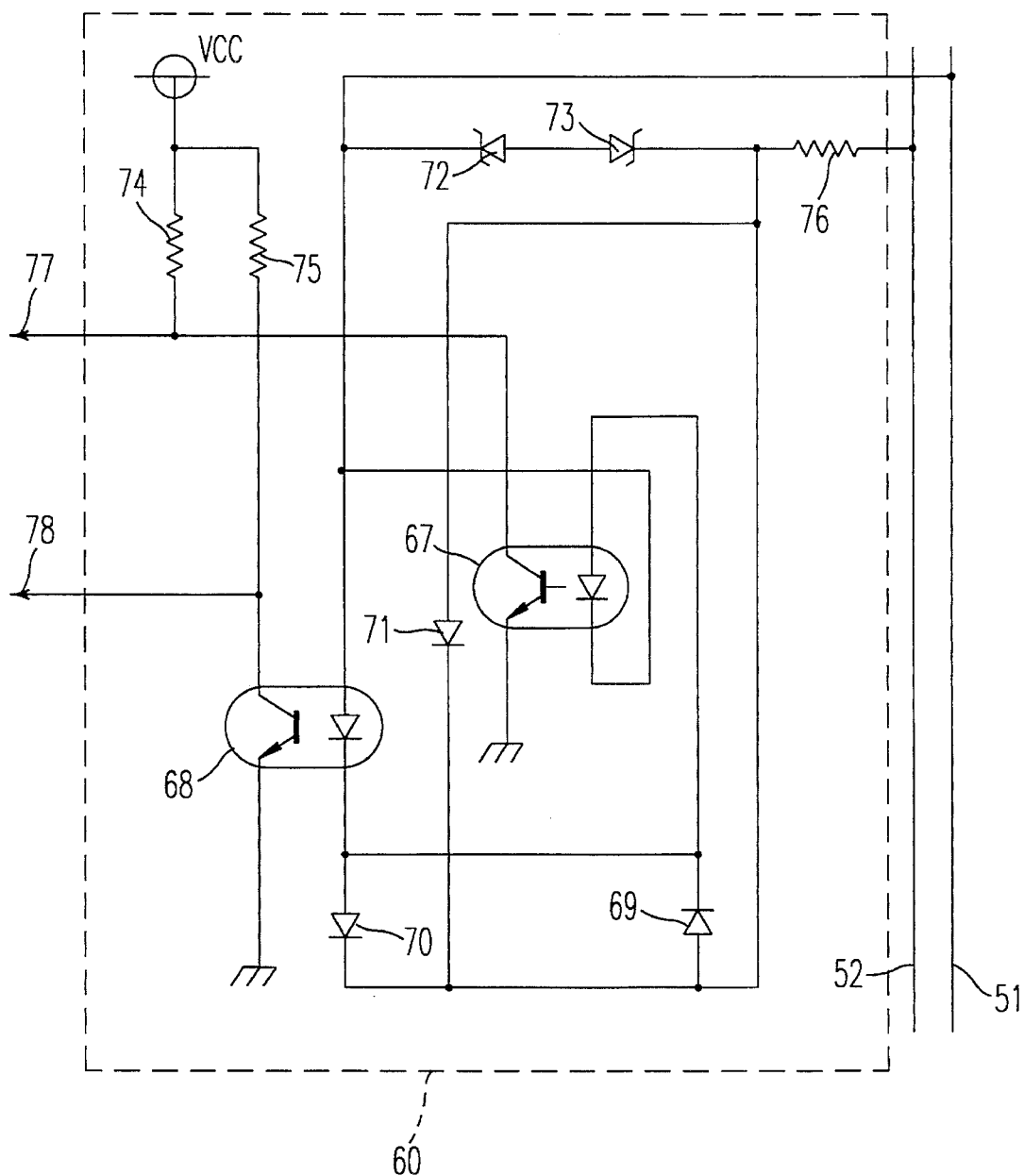
FIG. 12 is a circuit diagram of a conventional polarity detector.
Figures 13A, 13B, 13C:
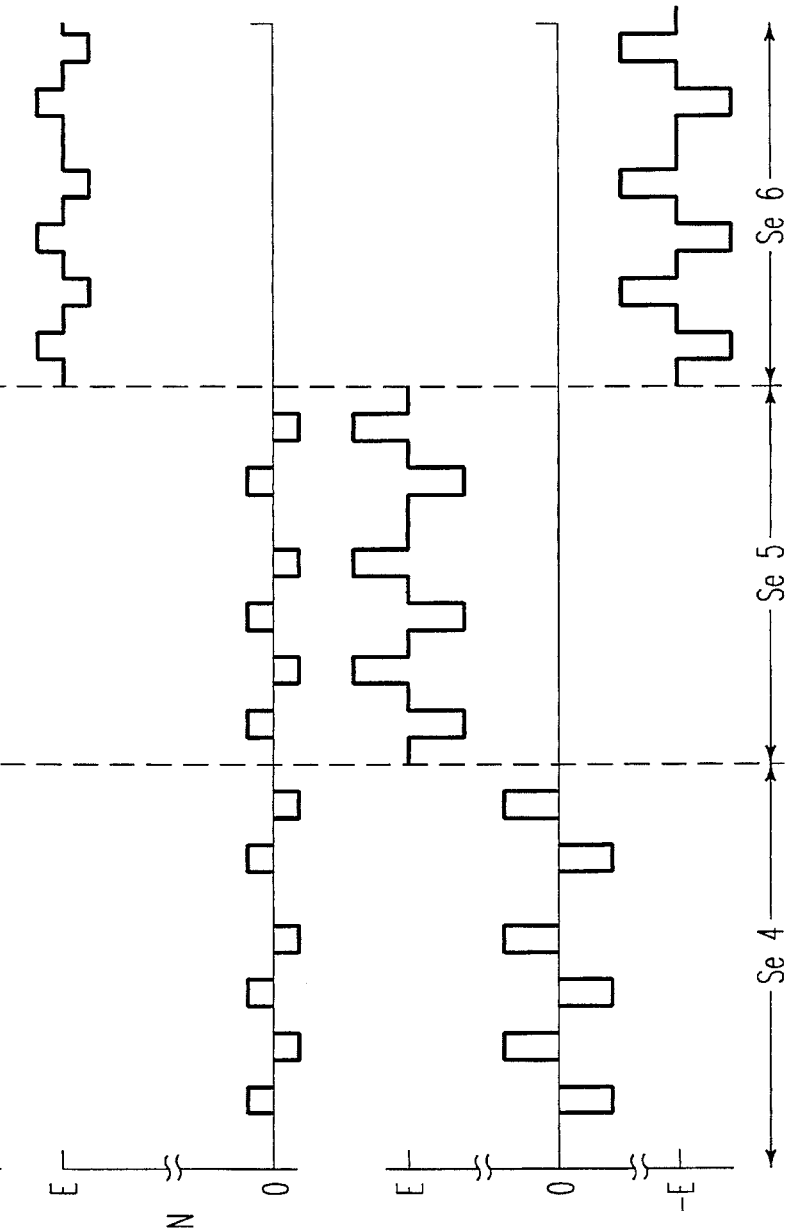
FIG. 13 illustrates the operation of the conventional polarity detector.

A first preferred embodiment according to the present invention will be described hereinafter with reference to the drawings. FIG. 1 is a block diagram of a polarity detector having the polarity detecting function according to the first preferred embodiment of the present invention. In FIG. 1, the reference numerals 1 and 2 designate transmission paths identical with the transmission paths 51 and 52 of FIG. 10; 100 designates a polarity detector having the function of detecting the polarity of a DC voltage given from the transmission paths 1 and 2; 3 and 4 designate input terminals provided in the polarity detector 100 and connected to the transmission paths 1 and 2, respectively; 5 designates a current detector portion for detecting a current flowing from the input terminals 3, 4 to the transmission paths 1, 2 to output a voltage according to the current; and 6 and 7 designate comparators receiving and discriminating the voltage provided by the current detector portion 5. The comparators 6 and 7 form a comparing circuit, and output signals 8, 9 of the respective comparators 6, 7 are the output of the comparing circuit.

The current detector portion 5 includes a voltage-to-current converter 21 connected to the input terminal for producing a current according to the potential at the input terminal 3; a voltage-to-current converter 22 connected to the input terminal 4 for producing a current according to the potential at the input terminal 4; a current adder 23 (hereinafter referred to as an adder) connected to the voltage-to-current converters 21, 22 for performing addition or subtraction between the output currents of the voltage-to-current converters 21, 22 to output a current provided as a result of the analog operation; a current-to-voltage converter 24 connected to the adder 23 for converting the current fed by the adder 23 into an output voltage 14 on the basis of a predetermined potential (an output potential of a reference voltage generator 25); and a reference voltage generator 25 for generating a reference voltage 12 serving as a reference.

The comparator 6 is connected to the reference voltage generator 25 and the current-to-voltage converter 24 and receives, for example, the output voltage 14 of the current-to-voltage converter 24 at its inverting input terminal while receiving the reference voltage 12 of the reference voltage generator 25 at its non-inverting input terminal. The comparator 7 is connected to the reference voltage generator 25 and the current-to-voltage converter 24 and receives, for example, the output voltage 14 of the current-to-voltage converter 24 at its non-inverting input terminal while receiving the reference voltage 12 of the reference voltage generator 25 at its inverting input terminal. It should be noted that the comparators 6, 7, the reference voltage generator 25, and the current-to-voltage converter 24 operate on the basis of respective predetermined potentials for detection of the polarity of the potential difference between the transmission paths 1 and 2. For example, the comparators 6, 7, the reference voltage generator 25 and the current-to-voltage converter 24 are connected to the ground potential in common.

Figure 5:
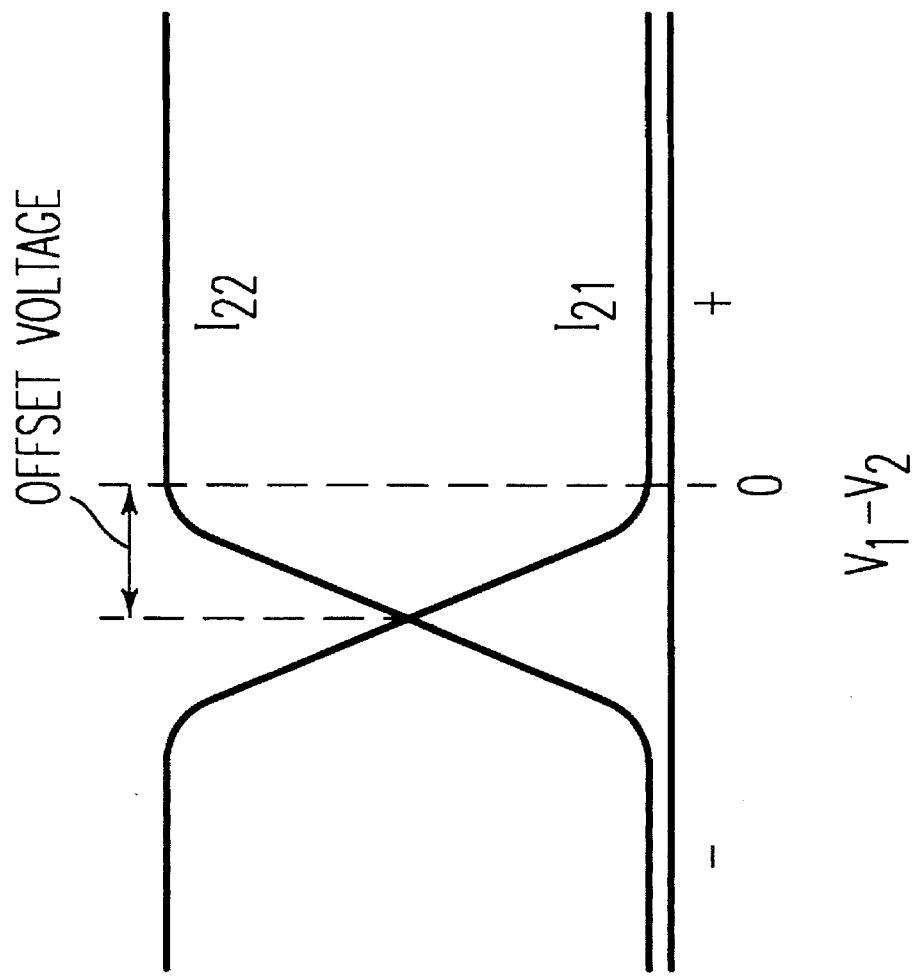
FIG. 5 illustrates operating characteristics of the circuit of FIG. 4.

The offset voltage of the comparators 6, 7 is lower than 0 V. A region between the offset voltage of the comparators 6, 7 and 0 V is a dead zone for the comparing circuit, as shown in FIG. 5. The characteristics shown in FIG. 5 are those of the comparators 6, 7. In FIG. 5, $V_1$ indicates a voltage applied to the non-inverting input terminal of the comparator; $V_2$ indicates a voltage applied to the inverting input terminal of the comparator; and $I_{21}$, $I_{22}$ indicate internal currents flowing in accordance with the voltages applied to the inverting and non-inverting input terminals of the comparator for outputting the output signal of the comparator. It is apparent from FIG. 5 that the currents $I_{21}$ and $I_{22}$ for producing the output signal are switched where $V_1 - V_2$ is lower than 0 V and that the comparator switches the output signal between a high level and low level in a range lower than 0 V.

An example of an operation of the polarity detector 100 will be discussed below with reference to FIG. 2. For the purpose of simplification, it is assumed that the voltage-to-current converters 21 and 22 output currents of the same magnitude when the transmission paths 1 and 2 are at the same potential. The current-to-voltage converter 24 is adapted to add the converted voltage to the reference voltage 12 of the reference voltage generator 25.

In the state Se1 of FIG. 2, the transmission paths 1 and 2 are at the ground potential (0 V). The potential at the transmission path I is applied to the voltage-to-current converter 21 through the input terminal 3, and the potential at the transmission path 2 is applied to the voltage-to-current converter 22 through the input terminal 4. The voltage-to-current converters 21, 22 output the currents of the same magnitude according to the ground potential. The adder 23 performs addition between the output currents of the voltage-to-current converters 21 and 22 if the directions of the output currents are different, and performs subtraction therebetween if the directions are the same. Thus, the adder 23 outputs a current of 0 ampere when the transmission paths 1 and 2 are at the same potential (0 V).

The current-to-voltage converter 24 outputs the output voltage 14 which is equal to the reference voltage 12 of the reference voltage generator 25 since the current from the adder 23 is zero. The comparators 6 and 7 receive the output of the current-to-voltage converter 24 and output the high-level signal since the inverting input terminal and the non-inverting input terminal are at the same potential (a potential difference of 0 V).

In the state Se2, it is assumed that the transmission path 2 is at the ground potential and the transmission path 1 is at a potential E. The voltage-to-current converters 21, 22 output currents according to the potentials at the transmission paths 1, 2, the current of the voltage-to-current converter 21 being greater than that of the voltage-to-current converter 22. The current fed by the adder 23 is in the same direction as the output current of the voltage-to-current converter 21. The current-to-voltage converter 24 converts the current into the output voltage 14 which is given by subtracting the voltage according to the output current of the adder 23 from the reference voltage 12 and is hence lower than the reference voltage 12 of the reference voltage generator 25. This results in the potential at the non-inverting input terminal of the comparator 7 being higher than the potential at the inverting input terminal thereof, and the absolute value of the potential difference therebetween is higher than that of the offset voltage. Then the comparator 7 outputs the low-level signal. The potential at the non-inverting input terminal of the comparator 6 is higher than the potential at the inverting input terminal thereof, and the comparator 6 outputs the high-level signal. It may be judged that the potential at the transmission path 1 is higher than the potential at the transmission path 2 since the output of the comparator 6 is at the high level and the output of the comparator 7 is at the low level.

In the state Se3, it is assumed that the transmission path 1 is at the ground potential and the transmission path 2 is at the potential E. The voltage-to-current converters 21, 22 output currents according to the potentials at the transmission paths 1, 2, the current of the voltage-to-current converter 22 being greater than that of the voltage-to-current converter 21. The current fed by the adder 23 is in the same direction as the output current of the voltage-to-current converter 22. The current-to-voltage converter 24 converts the current into the output voltage 14 which is given by adding the voltage according to the output current of the adder 23 to the reference voltage 12 and is hence higher than the reference voltage 12 of the reference voltage generator 25. This results in the potential at the inverting input terminal of the comparator 6 being higher than the potential at the non-inverting input terminal thereof, the absolute value of the potential difference therebetween being higher than that of the offset voltage. Then the comparator 6 outputs the low-level signal. The potential at the non-inverting input terminal of the comparator 7 is higher than the potential at the inverting input terminal thereof, and the comparator 7 outputs the high-level signal. It may be judged that the potential at the transmission path 2 is higher than the potential at the transmission path 1 since the output of the comparator 6 is at the low level and the output of the comparator 7 is at the high level.

Figure 3:
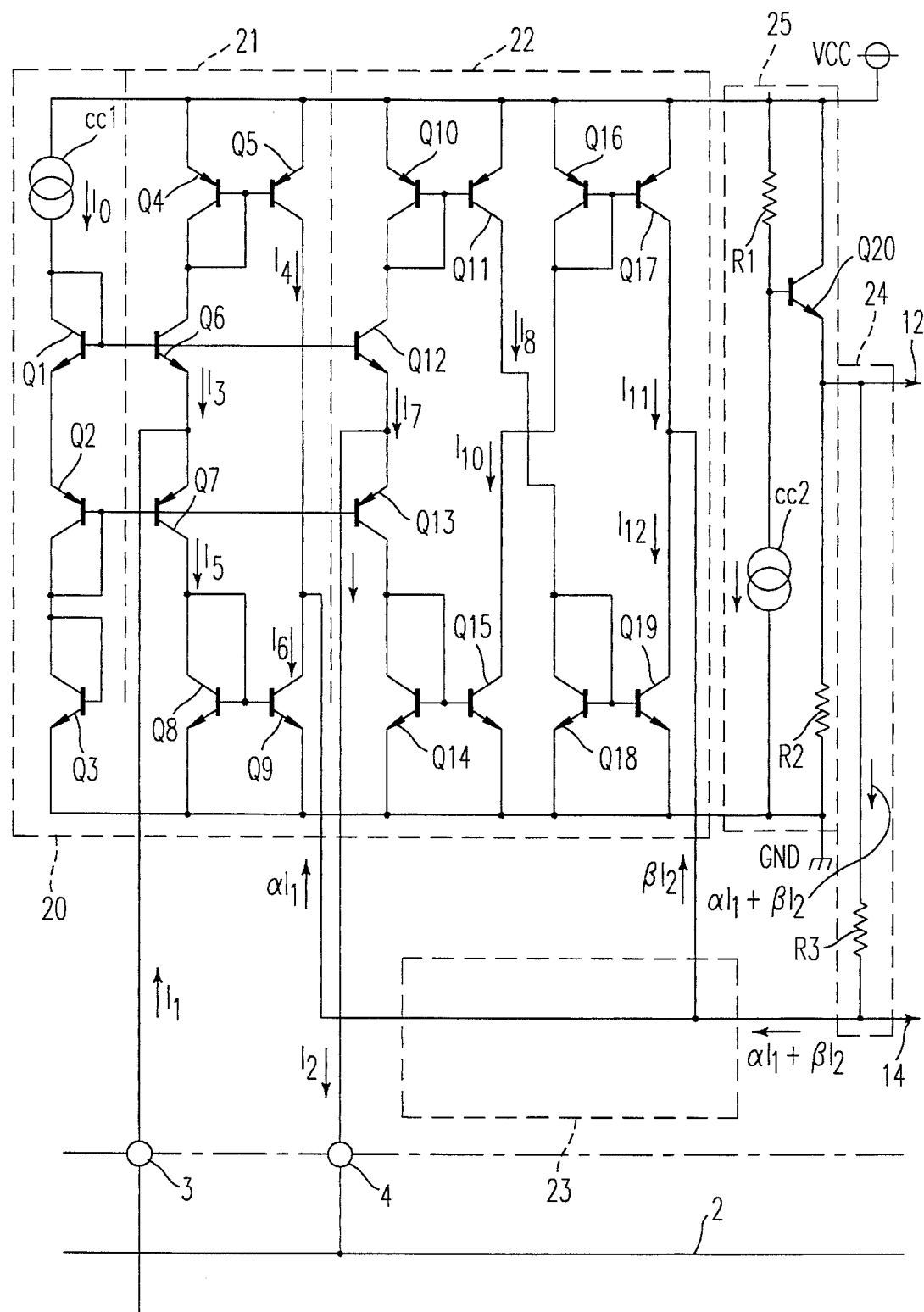
FIG. 3 is a circuit diagram of a current detector according to the first preferred embodiment of the present invention.

FIG. 3 is a circuit diagram showing an example of respective parts of the polarity detector 100 of FIG. 1. Parts of FIG. 3 identical with or corresponding to those of FIG. 1 are designated by like reference numerals and characters.

In FIG. 3, the reference numeral 20 designates a constant voltage source for generating a constant voltage which is applied to the voltage-to-current converters 21, 22. The constant voltage source 20 includes transistors Q1 to Q3 and a constant current source cc1. The constant current source cc1 has an input connected to a power supply potential $V_{cc}$ and an output and feeds a constant current $I_0$ from the input to the output. The NPN transistor Q1 has a collector and base connected to the output of the constant current source cc1. The PNP transistor Q2 has an emitter connected to the emitter of the NPN transistor Q1. The NPN transistor Q3 has an emitter connected to the ground potential GND and a collector connected to the base and collector of the PNP transistor Q2. Thus, constant voltages are generated respectively at the collectors of the NPN and PNP transistors Q1 and Q2 on the basis of the ground potential GND.

The voltage-to-current converter 21 includes transistors Q4 to Q9. The PNP transistor Q4 has an emitter connected to the power supply potential $V_{cc}$, and interconnected base and collector. The PNP transistor Q5 has an emitter connected to the power supply potential $V_{cc}$ and a base connected to the base of the PNP transistor Q4. It will be appreciated from FIG. 3 that the PNP transistors Q4 and Q5 form a current mirror circuit. The NPN transistor Q6 has a collector connected to the collector of the PNP transistor Q4 and an emitter connected to the input terminal 3. The NPN transistor Q6 also has a base connected to the collector of the NPN transistor Q1, which provides a constant base potential.

The NPN transistor Q8 has an emitter connected to the ground potential GND, and an interconnected base and collector. The NPN transistor Q9 has an emitter connected to the ground potential GND and a base connected to the base of the NPN transistor Q8. The NPN transistors Q8 and Q9 form a current mirror circuit. The collector of the NPN transistor Q9 and the collector of the PNP transistor Q5 which are outputs of the current mirror circuits are connected to each other. The PNP transistor Q7 has a collector connected to the collector of the NPN transistor Q8 and an emitter connected to the input terminal 3. The PNP transistor Q7 also has a base connected to the collector of the PNP transistor Q2, which provides a constant base potential.

The voltage-to-current converter 22 includes transistors Q10 to Q19. The PNP transistor Q10 has an emitter connected to the power supply potential $V_{cc}$, and an interconnected base and collector. The PNP transistor Q 11 has an emitter connected to the power supply potential $V_{cc}$ and a base connected to the base of the PNP transistor Q10. It will be appreciated from FIG. 3 that the PNP transistors Q10 and Q11 form a current mirror circuit. The PNP transistor Q16 has an emitter connected to the power supply potential $V_{cc}$, and an interconnected base and collector. The PNP transistor Q17 has an emitter connected to the power supply potential $V_{cc}$ and a base connected to the base of the PNP transistor Q16. The PNP transistors Q16 and Q17 form a current mirror circuit.

The NPN transistor Q 12 has a collector connected to the collector of the PNP transistor Q10 and an emitter connected to the input terminal 4. The NPN transistor Q12 also has a base connected to the collector of the NPN transistor Q1, which provides a constant base potential.

In a general semiconductor integrated circuit, a parasitic element sometimes functions when the input voltage is negative. However, the input voltage of the polarity detector 100 is not negative since the emitter potentials of the NPN transistors Q6 and Q12 are limited to the potential which is lower than the base potential by the amount of the base-emitter voltage.

The NPN transistor Q14 has an emitter connected to the ground potential GND, and an interconnected base and collector. The NPN transistor Q15 has an emitter connected to the ground potential GND and a base connected to the base of the NPN transistor Q14. The NPN transistors Q14 and Q15 form a current mirror circuit. The NPN transistor Q18 has an emitter connected to the ground potential GND, and an interconnected base and collector. The NPN transistor Q 19 has an emitter connected to the ground potential GND and a base connected to the base of the NPN transistor Q18. The NPN transistors Q18 and Q19 form a current mirror circuit.

The PNP transistor Q13 has a collector connected to the collector of the NPN transistor Q14 and an emitter connected to the input terminal 4. The PNP transistor Q13 also has a base connected to the collector of the PNP transistor Q2, which provides a constant base potential.

The collector of the NPN transistor Q15 serving as an output of the current mirror circuit and the collector of the PNP transistor Q16 serving as an input of the current mirror circuit are connected to each other. The collector of the PNP transistor Q 11 serving as an output of the current mirror circuit and the collector of the NPN transistor Q18 serving as an input of the current mirror circuit are connected to each other. The collector of the PNP transistor Q17 serving as an output of the current mirror circuit and the collector of the NPN transistor Q19 serving as an output of the current mirror circuit are connected to each other. The current output terminals of the voltage-to-current converters 21 and 22 are provided at the collectors of the NPN transistors Q9 and Q19, respectively.

A relation between the potential at the transmission path 1 and the power supply potential $V_{cc}$ determines the magnitude of a current $I_3$ flowing in the NPN transistor Q6, and a relation between the potential at the transmission path i and the ground potential GND determines a current $I_5$ flowing in the PNP transistor Q7. A current $I_1$ inputted to the input terminal 3 from the transmission path 1 is the difference between the currents $I_3$ and $I_5$. The current $I_3$ flowing between the emitter and collector of the PNP transistor Q4 is proportional to a current $I_4$ flowing between the emitter and collector of the PNP transistor Q5. Thus $I_3=\alpha \cdot I_4$ where $\alpha$ is a proportionality constant. Similarly, $I_5=\alpha \cdot I_6$ where cc is a proportionality constant between currents $I_5$ and $I_6$. The collector of the NPN transistor Q9 outputs a current corresponding to the difference between the currents $I_4$ and $I_6$. Thus the magnitude of the current is $\alpha \cdot I_1$.

A relation between the potential at the transmission path 2 and the power supply potential $V_{cc}$ determines the magnitude of a current $I_7$ flowing in the NPN transistor Q12, and a relation between the potential at the transmission path 2 and the ground potential GND determines a current $I_9$ flowing in the PNP transistor Q13. A current $I_2$ flowing out of the input terminal 4 into the transmission path 2 is the difference between the currents $I_7$ and $I_9$. The current $I_7$ flowing between the emitter and collector of the PNP transistor Q10, a current $I_8$ flowing between the emitter and collector of the PNP transistor Q11, and a current $I_{12}$ flowing between the emitter and collector of the NPN transistor Q19 are proportional to each other. Thus $I_7 = \beta \cdot I_{12}$ where $\beta$ is a proportionality constant. Similarly, $I_9 = \beta \cdot I_{11}$ where $\beta$ is a proportionality constant between currents $I_9$ and $I_{11}$. The collector of the NPN transistor Q19 outputs a current corresponding to the difference between the currents $I_{12}$ and $I_{11}$. Thus the magnitude of the current is $\beta \cdot I_2$.

The voltage-to-current converter 22 includes two more current mirror circuits than the voltage-to-current converter 21, thereby to output a current flowing in the direction reverse to the direction of the output current of the voltage-to-current converter 21 when the transmission paths 1 and 2 are at the same potential.

This enables the current adder 23 to be of simple construction including only connection between the current output terminals of the voltage-to-current converters 21 and 22. The output current of the adder 23 is $\alpha \cdot I_1 + \beta \cdot I_2$.

The reference voltage generator 25 includes resistors R1, R2, a constant current source cc2, and an NPN transistor Q20. The resistor R1 has a first end connected to the power supply potential $V_{cc}$ and a second end connected to the input of the constant current source cc2. The constant current source cc2 has an output connected to the ground potential GND for feeding a constant current from the second end of the resistor R1 to the power supply potential. The NPN transistor Q20 has a collector connected to the power supply potential $V_{cc}$, a base connected to the second end of the resistor R1, and an emitter producing the reference voltage 12. The resistor R2 has a first end connected to the emitter of the NPN transistor Q20 and a second end connected to the ground potential GND.

The current-to-voltage converter 24 includes a resistor R3 having a first end connected to the output of the adder 23 and to the emitter of the NPN transistor Q20, and a second end connected to the emitter of the NPN transistor Q20. The current-to-voltage converter 24 converts the applied current $(\alpha \cdot I_1 + \beta \cdot I_2)$ into a voltage on the basis of the emitter potential of the NPN transistor Q20.

Figure 4:
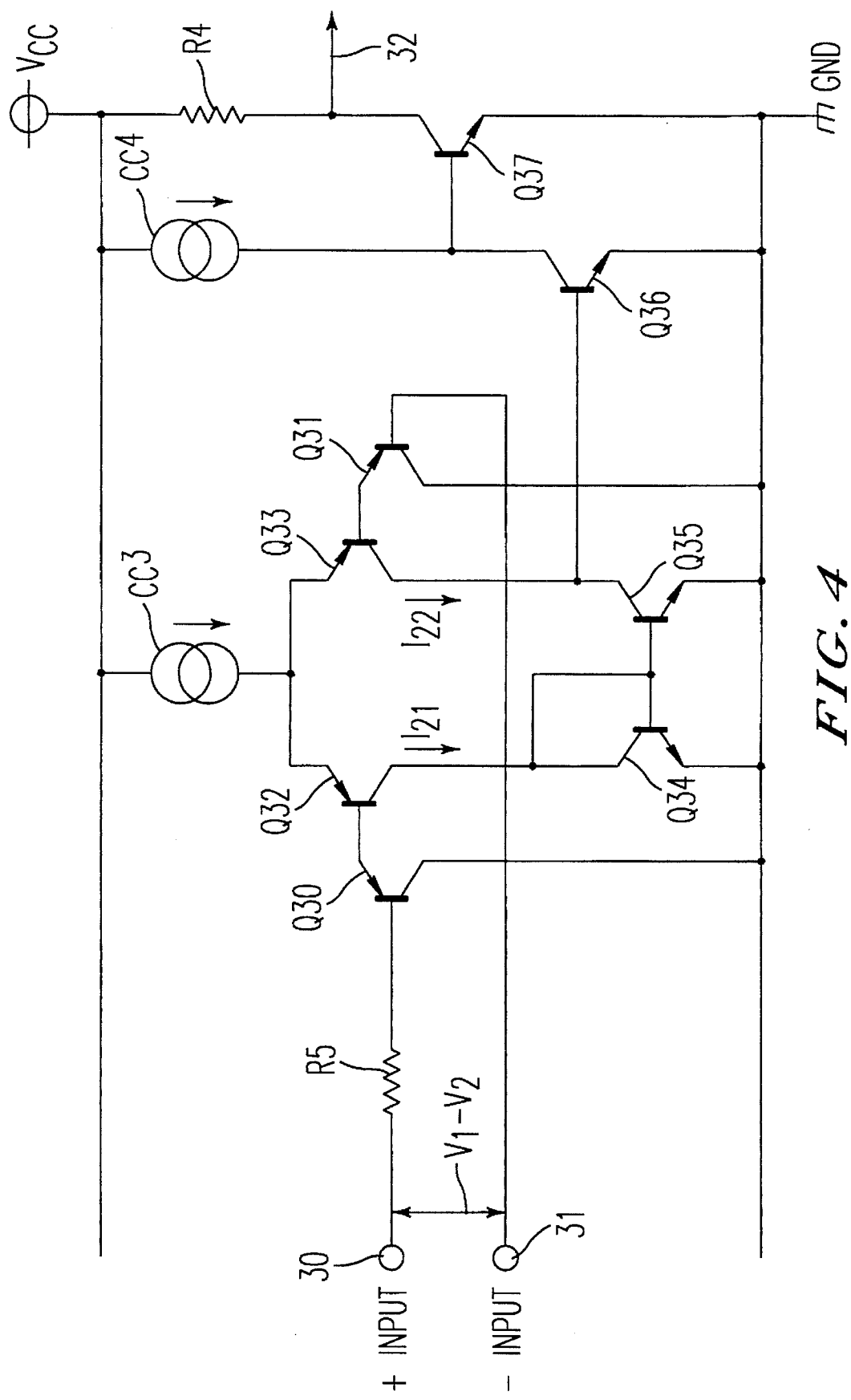
FIG. 4 is a circuit diagram for delineating a comparing circuit according to the first preferred embodiment of the present invention.

The comparing circuit will be discussed below with reference to FIG. 4. FIG. 4 is a circuit diagram of the comparators 6, 7 of FIG. 1. In FIG. 4, the reference numeral 30 designates a non-inverting input terminal; 31 designates an inverting input terminal; and 32 designates an output terminal. The non-inverting input terminal 30 is connected to the first end of a resistor R5. A PNP transistor Q30 has a base connected to the second end of the resistor R5 and a collector connected to the ground potential GND. A PNP transistor Q31 has a base connected to the inverting input terminal 31 and a collector connected to the ground potential GND.

PNP transistors Q32 and Q33 are a transistor pair having an emitter-to-emitter connection. A constant current is supplied to the emitters of the PNP transistors Q32, Q33 from the power supply potential $V_{cc}$ through a constant current source cc3. The bases of the PNP transistors Q32, Q33 are connected to the emitters of the PNP transistors Q30, Q31, respectively. NPN transistors Q34, Q35 form a current mirror circuit. The emitters of the NPN transistors Q34, Q35 are connected to the ground potential GND, and the bases thereof are connected to each other. The NPN transistor Q34 has an interconnected collector and base. The collectors of the PNP transistors Q32, Q33 are connected to the collectors of the NPN transistors Q34, Q35, respectively. The collectors of the PNP transistors Q32, Q33 output the currents $I_{21}$, $I_{22}$ according to the voltages given from the non-inverting and inverting input terminals, respectively. An NPN transistor Q36 has a base connected to the collector of the NPN transistor Q35 and an emitter connected to the ground potential GND. A constant current is supplied to the collector of the NPN transistor Q36 from the power supply potential $V_{cc}$ through a constant current source cc4. An NPN transistor Q37 has a base connected to the collector of the NPN transistor Q36, a collector connected to the output terminal 32, and an emitter connected to the ground potential GND. A resistor R4 is connected between the power supply potential $V_{cc}$ and the collector of the NPN transistor Q37.

The comparators 6, 7 as above constructed have the characteristics shown in FIG. 5. The comparators 6, 7 are characterized in that their outputs are zero where the value $(V_1 - V_2)$ becomes negative which is given by subtracting the voltage $V_2$ of the inverting input terminal 31 from the voltage $V_1$ of the non-inverting input terminal 30. The function of the resistor R5 causes the input offset voltage to be negative.

For the operation of the first preferred embodiment, when the circuit of FIG. 4 is used as the comparator 6, the reference voltage 12 of FIG. 3 is applied to the non-inverting input terminal 30 and the output voltage 14 of FIG. 3 is applied to the inverting input terminal 31. On the other hand, when the circuit of FIG. 4 is used as the comparator 7, the output voltage 14 is applied to the non-inverting input terminal 30 and the reference voltage 12 is applied to the inverting input terminal 31.

The comparator 7 may have a positive input offset voltage and be adapted such that the inverting input terminal receives the output voltage 14 and the non-inverting input terminal receives the reference voltage 12. This provides effects similar to the first preferred embodiment.

The comparator 7 may have a negative input offset voltage lower than that of the comparator 6 and be adapted such that the output voltage 14 is applied to the inverting input terminal and the reference voltage 12 is applied to the non-inverting input terminal. This also provides similar effects.

Figure 6:
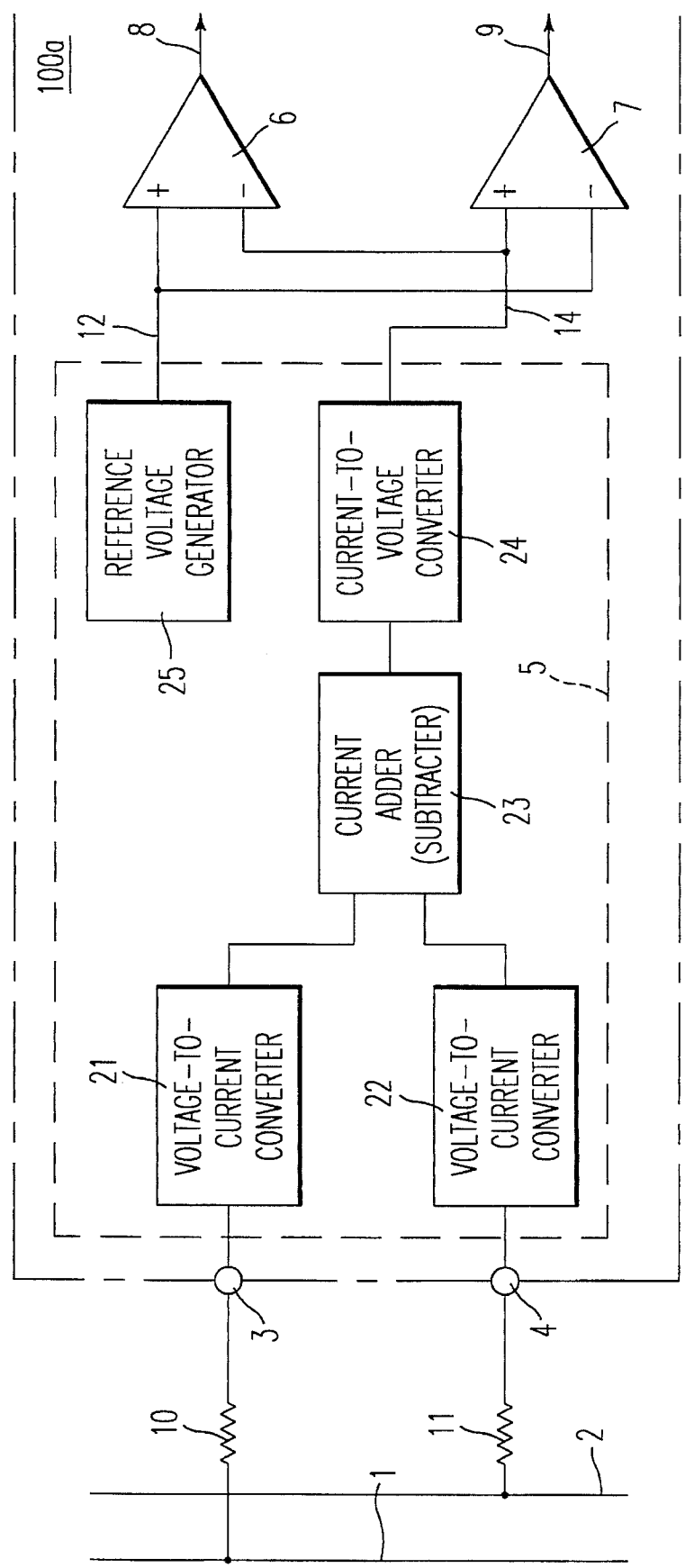
FIG. 6 is a block diagram of the polarity detector according to a second preferred embodiment of the present invention.

Description will now be given on a second preferred embodiment according to the present invention with reference to FIG. 6. FIG. 6 is a block diagram of the polarity detector according to the second preferred embodiment of the present invention. A polarity detector 100a of FIG. 6 includes resistors 10 and 11 connected between the input terminals 3, 4 of the polarity detector 100 of the first preferred embodiment and the transmission paths 1, 2, respectively. Thus, an input impedance of the polarity detector 100a as viewed from the transmission paths 1, 2 is larger than that of the polarity detector 100, permitting the restriction of the current inputted to the input terminals 3, 4. This provides an improved insulating property between the transmission paths 1, 2 and the internal circuits of the polarity detector 100a.

Figure 7:
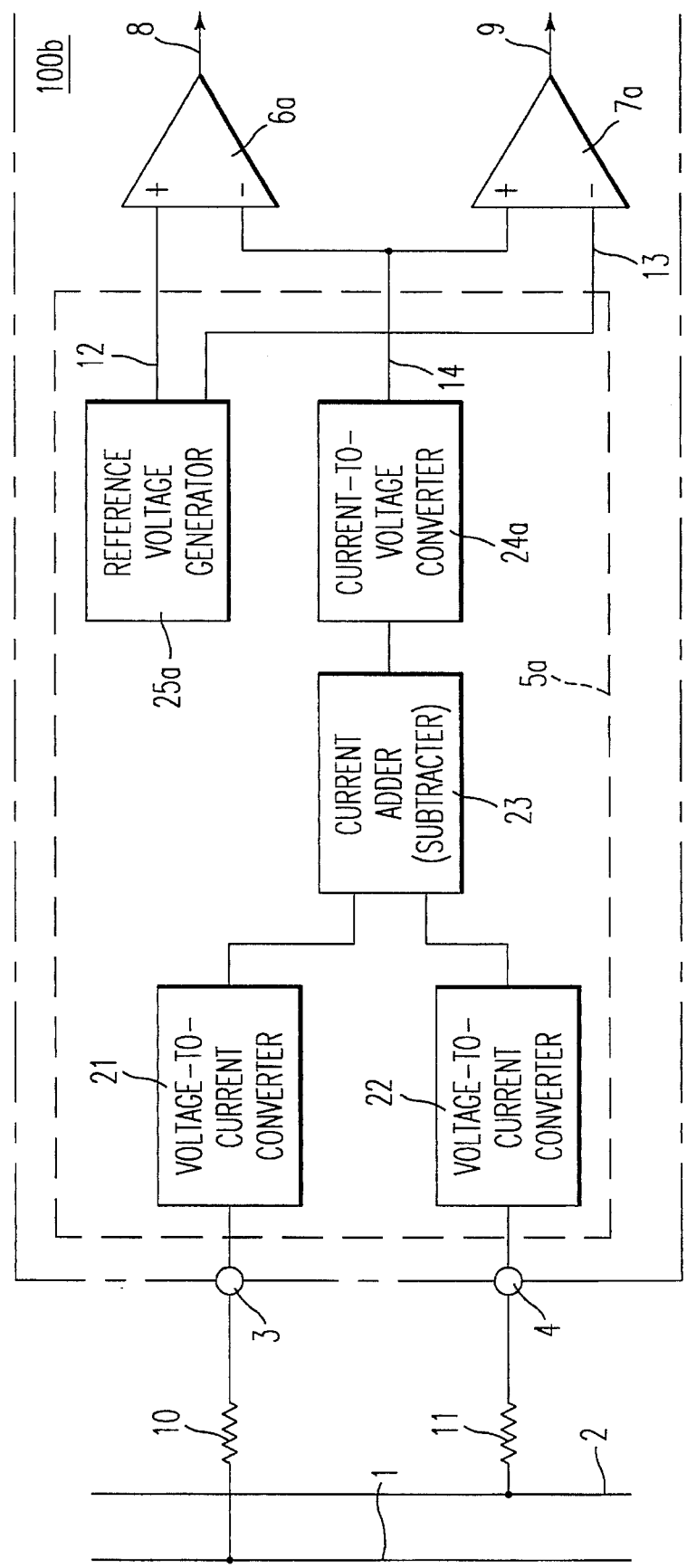
FIG. 7 is a block diagram of the polarity detector according to a third preferred embodiment of the present invention.

A third preferred embodiment according to the present invention will be discussed hereinafter with reference to FIGS. 7 to 9. FIG. 7 is a block diagram of the polarity detector according to the third preferred embodiment of the present invention. A polarity detector 100b of the third preferred embodiment differs from the polarity detector 100a of the second preferred embodiment in that the polarity detector 100b comprises a current-to-voltage converter 24a, a reference voltage generator 25a, and comparators 6a, 7a.

In the first and second preferred embodiments, the current-to-voltage converter 24 adds the converted voltage to the reference voltage provided by the reference voltage generator 25 to output the resultant voltage to the comparators 6, 7. The reference voltage generator 25 generates only one reference voltage. To provide the dead zone, it is necessary that the offset voltage of the comparators 6, 7 is shifted from 0 V.

In the third preferred embodiment, the reference voltage generator 25a generates three reference voltages of different magnitudes. The current-to-voltage converter 24a converts the current into a voltage on the basis of one of the reference voltages which is of medium magnitude. The comparing circuit then compares the converted output voltage 14 with the higher and lower reference voltages. This enables the judgement of the potential difference between the transmission paths 1 and 2 by providing the dead zone.

For this purpose, the higher reference voltage 12 provided by the reference voltage generator 25a is applied to the non-inverting input terminal of the comparator 6a, whereas the lower reference voltage 13 is applied to the inverting input terminal of the comparator 7a. The output voltage 14 from the current-to-voltage converter 24a is applied to the inverting input terminal of the comparator 6a and to the non-inverting input terminal of the comparator 7a.

Figure 8:
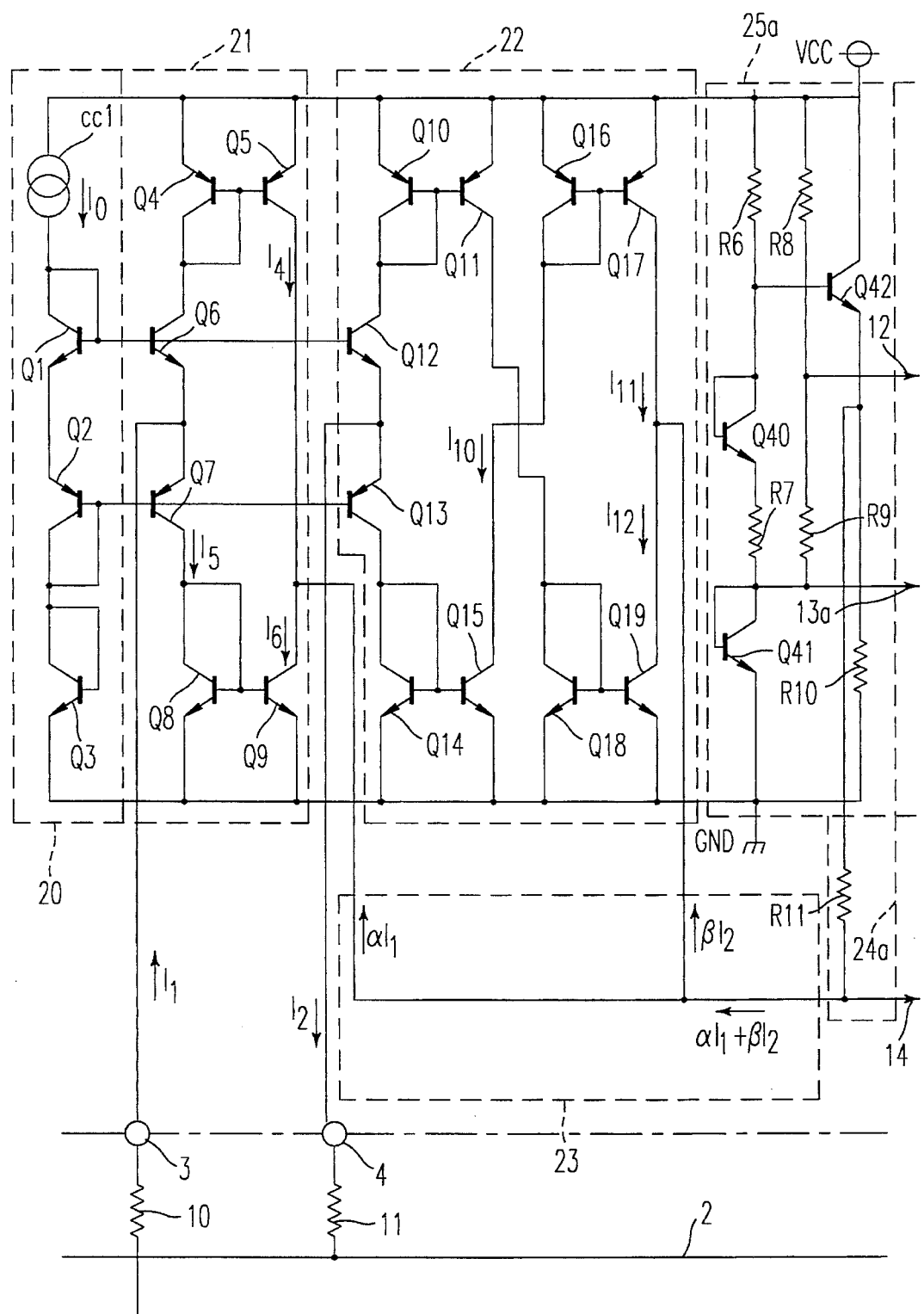
FIG. 8 is a circuit diagram of the current detector according to the third preferred embodiment of the present invention.

FIG. 8 shows the construction of the current-to-voltage converter 24a and the reference voltage generator 25a. The constant voltage source 20, the voltage-to-current converters 21, 22, and the current adder 23 of FIG. 8 are similar in construction to those of the first and second preferred embodiments. The reference voltage generator 25a includes resistors R6 to R10 and NPN transistors Q40 to Q42. The resistor R6 has a first end connected to the power supply potential $V_{cc}$.

The base and collector of the NPN transistor Q40 are connected to the second end of the resistor R6. The resistor R7 has a first end connected to the emitter of the NPN transistor R40. The NPN transistor Q41 has a collector and base connected to the second end of the resistor R7 and an emitter connected to the ground potential GND. The collector of the NPN transistor Q41 outputs the reference voltage 13.

The resistor R8 has a first end connected to the power supply potential $V_{cc}$ and a second end connected to the first end of the resistor R9. The resistor R9 has a second end connected to the collector of the NPN transistor Q41. The first end of the resistor R9 outputs the reference voltage 12.

The NPN transistor Q42 has a collector connected to the power supply potential $V_{cc}$, a base connected to the second end of the resistor R6, and an emitter connected to the first end of the resistor R10. The resistor R10 has a second end connected to the ground potential GND and generates at its first end the medium reference voltage which is intermediate the reference voltages 12 and 13.

The current-to-voltage converter 24a includes a resistor R11. The resistor R11 has a first end connected to the first end of the resistor R10 and a second end receiving the current $(\alpha \cdot I_1 + \beta \cdot I_2)$ fed by the adder 23.

For example, it is assumed that the transmission paths 1, 2 are at the ground potential (0 V) as in the state Se1 of FIG. 2. The potential at the transmission path 1 is applied to the voltage-to-current converter 21 through the input terminal 3, and the potential at the transmission path 2 is applied to the voltage-to-current converter 22 through the input terminal 4. The voltage-to-current converters 21, 22 then output the currents of the same magnitude according to the ground potential. The current $(\alpha \cdot I_1 + \beta I_2)$ fed the adder 23 is 0 ampere as described in the first preferred embodiment.

The current-to-voltage converter 24a, on receipt of the zero current from the adder 23, outputs the output voltage 14 which is the medium voltage between the reference voltages 12 and 13 provided by the reference voltage generator 25a. The comparators 6a, 7a receiving the output of the current-to-voltage converter 24a are such that the potential at the inverting input terminal is lower than the potential at the non-inverting input terminal, thereby to output the high-level signal.

It is now assumed that the transmission path 2 is at the ground potential and the transmission path 1 is at the potential E as in the state Se2. The voltage-to-current converters 21, 22 output currents in accordance with the potentials at the transmission paths 1, 2, the current of the voltage-to-current converter 21 being greater than that of the voltage-to-current converter 22. The current $(\alpha \cdot I_1 + \beta \cdot I_2)$ fed by the adder 23 is in the same direction as the output current $\alpha I_1$ of the voltage-to-current converter 21 as shown. The current-to-voltage converter 24a converts the current into the output voltage 14 which is lower than the reference voltage 13 provided by the reference voltage generator 25a. This results in the potential at the inverting input terminal of the comparator 7a being higher than the potential at the non-inverting input terminal thereof, and the comparator 7a outputs the low-level signal. The potential at the inverting input terminal of the comparator 6a is lower than the potential at the non-inverting input terminal thereof, and the comparator 6a outputs the high-level signal. It may be judged that the potential at the transmission path 1 is higher than the potential at the transmission path 2 since the comparator 6a is at the high level and the comparator 7a is at the low level.

In order that the comparator 7a outputs the low-level signal, it is necessary that $V_{13} < r_{11} \cdot (\alpha \cdot I_1 + \beta \cdot I_2)$ where $V_{13}$ is a difference between the medium reference voltage and the reference voltage 13 provided by the reference voltage generator 25a, and $r_{11}$ is a resistance of the resistor R11. This provides a part of the dead zone.

It is now assumed that the transmission path 1 is at the ground potential and the transmission path 2 is at the potential E as in the state Se3. The voltage-to-current converters 21, 22 output currents in accordance with the potentials at the transmission paths 1, 2, the current of the voltage-to-current converter 22 being greater than that of the voltage-to-current converter 21. The current $(\alpha \cdot I_1 + \beta \cdot I_2)$ fed by the adder 23 is in the direction reverse to the output current $\beta I_2$ of the voltage-to-current converter 22. The current-to-voltage converter 24a converts the current into the output voltage 14 which is higher than the reference voltage 12 provided by the reference voltage generator 25a. This results in the potential at the inverting input terminal of the comparator 6a being higher than the potential at the non-inverting input terminal thereof, and the comparator 6a outputs the low-level signal. The potential at the inverting input terminal of the comparator 7a is lower than the potential at the non-inverting input terminal thereof, and the comparator 7a outputs the high-level signal. It may be judged that the potential at the transmission path 2 is higher than the potential at the transmission path 1 since the comparator 6a is at the low level and the comparator 7a is at the high level.

In order that the comparator 6a outputs the low-level signal, it is necessary that $V_{12}>r_{11}\cdot(a\alpha\cdot I_1+\beta\cdot I_2)$ where $V_{12}$ is a difference between the reference voltage 12 provided by the reference voltage generator 25a and the medium reference voltage. This provides a part of the dead zone. Thus the dead zone has a range given by $V_{12}>r_{11}\cdot(\alpha\cdot I_1+\beta\cdot I_2)>V_{13}$.

Figure 9:
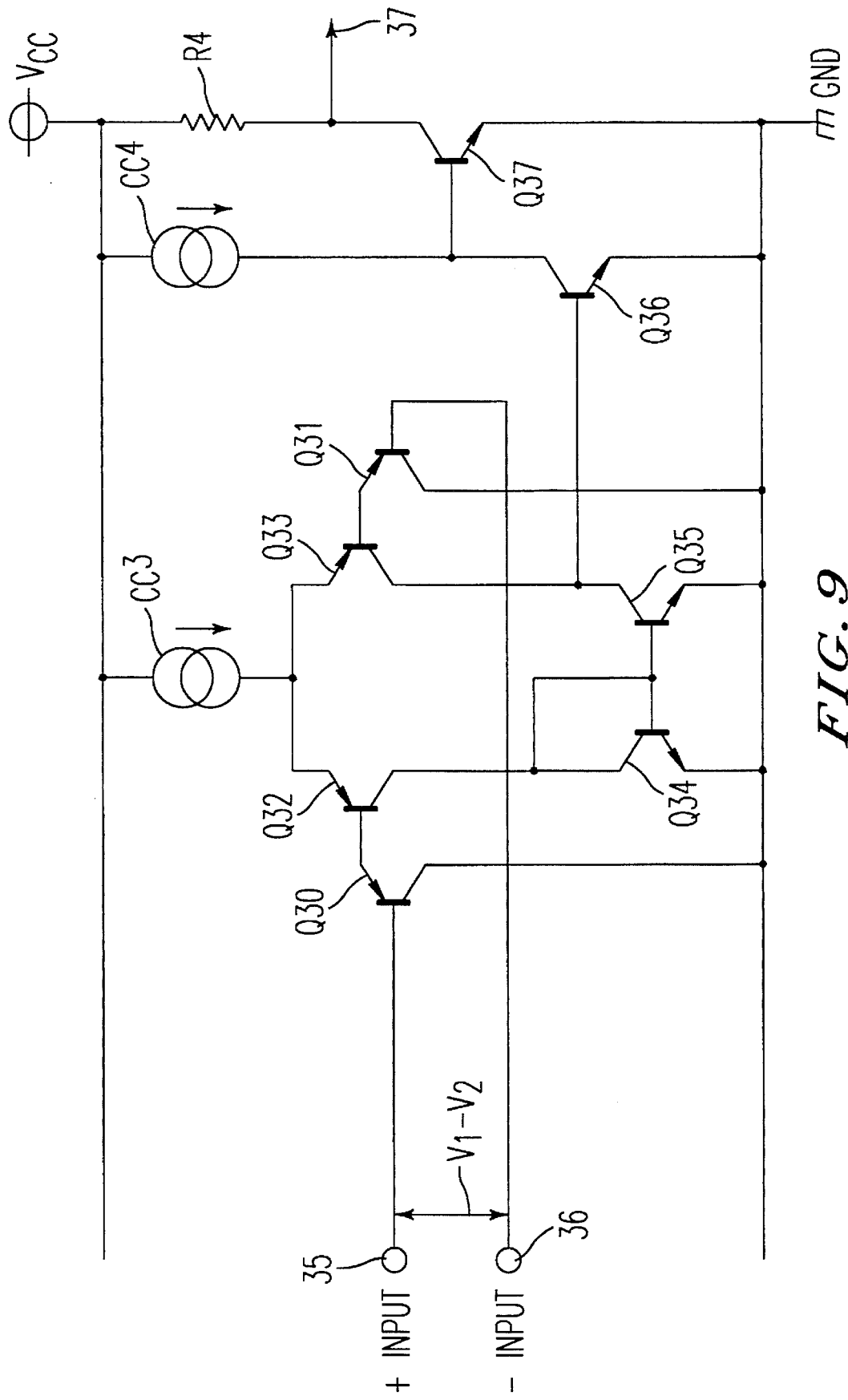
FIG. 9 is a circuit diagram for delineating the comparing circuit according to the third preferred embodiment of the present invention.

FIG. 9 shows the comparators 6a, 7a of the third preferred embodiment. The comparators 6a, 7a, which may have the input offset voltage of 0 V, is constructed such that the resistor R5 is removed from the circuit diagram of the comparator of FIG. 4. In FIG. 9, the reference numeral 35 designates a non-inverting input terminal; 36 designates an inverting input terminal; and 37 designates an output terminal.

For using the comparator of FIG. 9 as the comparator 6a, the reference voltage 12 is applied to the non-inverting input terminal 35 and the output voltage 14 is applied to the inverting input terminal 36. For using the comparator of FIG. 9 as the comparator 7a, the reference voltage 13 is applied to the inverting input terminal 36 and the output voltage 14 is applied to the non-inverting input terminal 35.

While the invention has been shown and described in detail, the foregoing description is in all aspects illustrative and not restrictive. It is therefore understood that numerous modifications and variations can be devised without departing from the scope of the invention.

What is claimed is:

1. A polarity detector comprising:
   a first input terminal connected to a first transmission path;
   a second input terminal connected to a second transmission path;
   a first voltage-to-current converter connected to said first input terminal for generating a current based on a first potential at said first input terminal;
   a second voltage-to-current converter connected to said second input terminal for generating a current based on a second potential at said second input terminal;
   voltage generator means receiving the currents from said first and second voltage-to-current converters for generating a voltage according to a potential difference between said first and second input terminals; and
   a discriminating circuit for determining whether the voltage provided by said voltage generator means is within a predetermined range, or less than a lower limit of said predetermined range, or more than an upper limit of said predetermined range to output a discrimination result.

2. The polarity detector of claim 1, wherein
said discriminating circuit includes:
   a first comparing portion having a first input end receiving a reference voltage, a second input end receiving the voltage provided by said voltage generator means, and an output end for making voltage comparison between said first and second input ends under a predetermined offset voltage; and
   a second comparing portion having a first input end receiving the voltage provided by said voltage generator means, a second input end receiving said reference voltage, and an output end for making voltage comparison between said first and second input ends under a predetermined offset voltage.

3. The polarity detector of claim 2, wherein
said voltage generator means includes:
   adder means connected to said first and second voltage-to-current converters and receiving the currents fed by said first and second voltage-to-current converters for performing addition or subtraction between the currents to output a current according to the potential difference between said first and second input terminals; and
   current-to-voltage converter means connected to said adder means for converting the current fed by said adder means into a voltage to output said voltage.

4. The polarity detector of claim 3,
wherein said first comparing portion includes a first comparator having
   a non-inverting input end receiving said reference voltage,
   an inverting input end receiving the voltage provided by said current-to-voltage converter means, and
   an output end,
   said offset voltage of said first comparator based on said inverting input end being negative, said first comparator for outputting a first signal level at said output end when a value given by subtracting the voltage of said inverting input end from the voltage of said non-inverting input end is higher than said offset voltage of said first comparator, and for outputting a second signal level at said output end when said value is lower than said offset voltage, and
wherein said second comparing portion includes a second comparator having
   an inverting input end receiving said reference voltage,
   a non-inverting input end receiving the voltage provided by said current-to-voltage converter means, and
   an output end,
   said offset voltage of said second comparator based on said inverting input end being negative, said second comparator for outputting a first signal level at said output end when a value given by subtracting the voltage of said inverting input end from the voltage of said non-inverting input end is higher than said offset voltage of said second comparator, and for outputting a second signal level at said output end when said value is lower than said offset voltage.

5. The polarity detector of claim 4,
wherein said first comparator includes:
   first resistor means having a first end connected to said non-inverting input end of said first comparator, and a second end;
   a first PNP transistor having a base connected to the second end of said first resistor means, a collector connected to a third potential, and an emitter;
   a second PNP transistor having a base connected to the inverting input end of said first comparator, a collector connected to said third potential, and an emitter;
   a third PNP transistor having a base connected to the emitter of said first PNP transistor, an emitter, and a collector;
   a fourth PNP transistor having a base connected to the emitter of said second PNP transistor, an emitter connected to the emitter of said third PNP transistor, and a collector;
   a first constant current source having a first end connected to a fourth potential higher than said third potential and a second end connected to the emitters of said third and fourth PNP transistors for feeding a predetermined constant current to the emitters of said third and fourth PNP transistors from said fourth potential;

a first NPN transistor having a collector connected to the collector of said third PNP transistor, a base connected to the collector of said third PNP transistor, and an emitter connected to said third potential;

a second NPN transistor having a collector connected to the collector of said fourth PNP transistor, a base connected to the base of said first NPN transistor, and an emitter connected to said third potential;

a third NPN transistor having a base connected to the collector of said second NPN transistor, an emitter connected to said third potential, and a collector;

a second constant current source having a first end connected to said fourth potential and a second end connected to the collector of said third NPN transistor for feeding a predetermined constant current to the emitter of said third NPN transistor from said fourth potential;

a fourth NPN transistor having a base connected to the collector of said third NPN transistor, an emitter connected to said third potential, and a collector; and second resistor means having a first end connected to said fourth potential and a second end connected to the collector of said fourth NPN transistor and the output end of said first comparator, and wherein said second comparator includes:

third resistor means having a first end connected to the non-inverting input end of said second comparator, and a second end;

a fifth PNP transistor having a base connected to the second end of said third resistor means, a collector connected to said third potential, and an emitter;

a sixth PNP transistor having a based connected to the inverting input end of said second comparator, a collector connected to said third potential, and an emitter;

a seventh PNP transistor having a base connected to the emitter of said fifth PNP transistor, an emitter, and a collector;

an eighth PNP transistor having a base connected to the emitter of said sixth PNP transistor, an emitter connected to the emitter of said seventh PNP transistor, and a collector;

a third constant current source having a first end connected to said fourth potential, and a second end connected to the emitters of said seventh and eighth PNP transistors for feeding a predetermined constant current to the emitters of said seventh and eighth PNP transistors from said fourth potential;

a fifth NPN transistor having a collector connected to the collector of said seventh PNP transistor, a base connected to the collector of said seventh PNP transistor, and an emitter connected to said third potential;

a sixth NPN transistor having a collector connected to the collector of said eighth PNP transistor, a base connected to the base of said fifth NPN transistor, and an emitter connected to said third potential;

a seventh NPN transistor having a base connected to the collector of said sixth NPN transistor, an emitter connected to said third potential, and a collector;

a fourth constant current source having a first end connected to said fourth potential and a second end connected to the collector of said seventh NPN transistor for feeding a predetermined constant current to the emitter of said seventh NPN transistor from said fourth potential;

an eighth NPN transistor having a base connected to the collector of said seventh NPN transistor, an emitter connected to said third potential, and a collector; and fourth resistor means having a first end connected to said fourth potential, and a second end connected to the collector of said eighth NPN transistor and the output end of said second comparator.

6. The polarity detector of claim 1, wherein said voltage generator means includes:

adder means connected to said first and second voltage-to-current converters and receiving the currents fed by said first and second voltage-to-current converters for performing addition or subtraction between the currents to output a current according to the potential difference between said first and second input terminals; and current-to-voltage converter means connected to said adder means for converting the current fed by said adder means into a voltage to output said voltage, wherein said discriminating circuit includes:

a first comparing portion having a first input receiving a reference voltage, a second input receiving the voltage provided by said current-to-voltage converter means, and an output end for making voltage comparison between said first and second inputs under a predetermined offset voltage; and a second comparing portion having a first input receiving the voltage provided by said current-to-voltage converter means, a second input receiving said reference voltage, and an output end for making voltage comparison between said first and second inputs under a predetermined offset voltage, and wherein said current-to-voltage converter means converts the current fed by said adder means into the voltage based on said reference voltage.

7. The polarity detector of claim 6, further comprising a reference voltage generator for generating said reference voltage, and connected to the first input of said first comparing portion and the second input of said second comparing portion, to apply said reference voltage to said first and second comparing portions.

8. The polarity detector of claim 7, wherein said reference voltage generator includes:

a constant current source having a first end connected to a third potential and a second end for feeding a current of a predetermined constant value to said third potential from said first end to said second end;

first resistor means having a first end connected to a fourth potential higher than said third potential, and a second end connected to the second end of said constant current source;

a first NPN transistor having a collector connected to said fourth potential, a base connected to the second end of said first resistor means, and an emitter; and second resistor means having a first end connected to the emitter of said first NPN transistor, and a second end connected to said third potential.

9. The polarity detector of claim 6, wherein said current-to-voltage converter means includes voltage drop means having a first end receiving the current fed by said adder means and a second end receiving said reference voltage, and wherein a voltage across said voltage drop means is generated in the form of said output voltage of said current-to-voltage converter means.

10. The polarity detector of claim 9, wherein:

said voltage drop means includes:
a resistor coupled between said first and second ends of said converter means.

11. The polarity detector of claim 1, wherein said first input terminal is connected to said first transmission path through first resistor means, and said second input terminal is connected to said second transmission path through second resistor means.

12. The polarity detector of claim 1, wherein said first voltage-to-current converter includes
a first NPN transistor having a base connected to a third potential, an emitter connected to said first input terminal, and a collector, and
a first PNP transistor having a base connected to a fourth potential lower than said third potential, an emitter connected to said first input terminal, and a collector,
said first voltage-to-current converter for feeding to said voltage generator means a current according to a difference between respective currents flowing to said first NPN and PNP transistors, and wherein said second voltage-to-current converter includes a second NPN transistor having a base connected to said third potential, an emitter connected to said second input terminal, and a collector, and
a second PNP transistor having a base connected to said fourth potential, an emitter connected to said second input terminal, and a collector,
said second voltage-to-current converter for feeding to said voltage generator means a current according to a difference between respective currents flowing to said second NPN and PNP transistors.

13. The polarity detector of claim 12, further comprising:

a constant current source having a first end connected to a fifth potential higher than said third potential and a second end for feeding a current of a predetermined constant value to the second end from said fifth potential;

first constant voltage generator means having a first end connected to the second end of said constant current source and a second end connected to the base of said first NPN transistor for producing said third potential in response to a predetermined current to apply said third potential to the bases of said first and second NPN transistors; and second constant voltage generator means having a first end connected to the second end of said first constant voltage generator means, a second end connected to a sixth potential lower than said fourth potential, and an output connected to the base of said first PNP transistor for producing said fourth potential in response to a predetermined current to apply said fourth potential to the bases of said first and second PNP transistors.

14. The polarity detector of claim 13, wherein said first constant voltage generator means includes
first diode means having an anode connected to the second end of said constant current source, and a cathode connected to the first end of said second constant voltage generator means, and wherein said second constant voltage generator means includes
second diode means having an anode connected to the cathode of said first diode means, and a cathode connected to the bases of said first and second PNP transistors, and
third diode means having an anode connected to the bases of said first and second PNP transistors, and a cathode connected to said sixth potential.

15. The polarity detector of claim 12, wherein said first voltage-to-current converter includes:
a first current mirror circuit having an input end connected to the collector of said first NPN transistor and an output end for feeding at said output end of said first current mirror circuit a current proportional to the current drawn from said input end of said first current mirror circuit; and
a second current mirror circuit having an input end connected to the collector of said first PNP transistor and an output end receiving the current fed by the output end of said first current mirror for accepting at said output end of said second current mirror circuit a current proportional to the current flowing into said input end of said second current mirror circuit, and wherein said second voltage-to-current converter includes:
a third current mirror circuit having an input end connected to the collector of said second NPN transistor and an output end for feeding at said output end of said third current mirror circuit a current proportional to the current drawn from said input end of said third current mirror circuit;
a fourth current mirror circuit having an input end connected to the collector of said second PNP transistor and an output end for accepting at said output end of said fourth current mirror circuit a current proportional to the current flowing into said input end of said fourth current mirror circuit;
a fifth current mirror circuit having an input end connected to the output end of said fourth current mirror circuit and an output end for feeding at said output end of said fifth current mirror circuit a current proportional to the current drawn from said input end of said fifth current mirror circuit; and
a sixth current mirror circuit having an input end connected to the output end of said third current mirror circuit and an output end receiving the current fed from the output end of said fifth current mirror circuit for accepting at said output end of said sixth current mirror circuit a current proportional to the current flowing into said input end of said sixth current mirror circuit.

16. The polarity detector of claim 15, wherein said voltage generator means includes:
a first line having a first end connected to the output end of said second current mirror circuit and a second end; and
a second line having a first end connected to the output end of said sixth current mirror circuit and a second end connected intermediate the first and second ends of said first line, and
said voltage generator means outputs a current according to the sum of the currents given from the first inputs of said first and second lines at the second end of said first line.

17. The polarity detector of claim 15, wherein said first current mirror circuit includes:
a third PNP transistor having an emitter connected to a fifth potential higher than said third potential, a collector connected to the collector of said first NPN transistor, and a base connected to the collector of said first NPN transistor; and a fourth PNP transistor having an emitter connected to said fifth potential, a base connected to the base of said third PNP transistor, and a collector, wherein said second current mirror circuit includes:

a third NPN transistor having an emitter connected to a sixth potential lower than said fourth potential, a collector connected to the collector of said first PNP transistor, and a base connected to the collector of said first PNP transistor; and a fourth NPN transistor having an emitter connected to said sixth potential, a base connected to the base of said third NPN transistor, and a collector connected to the collector of said fourth PNP transistor, wherein said third current mirror circuit includes:

a fifth PNP transistor having an emitter connected to said fifth potential, a collector connected to the collector of said second NPN transistor, and a base connected to the collector of said second NPN transistor; and a sixth PNP transistor having an emitter connected to said fifth potential, a base connected to the base of said fifth PNP transistor, and a collector, wherein said fourth current mirror circuit includes:

a fifth NPN transistor having an emitter connected to said sixth potential; a collector connected to the collector of said second PNP transistor, and a base connected to the collector of said second PNP transistor; and a sixth NPN transistor having an emitter connected to said sixth potential, a base connected to the base of said fifth NPN transistor, and a collector, wherein said fifth current mirror circuit includes:

a seventh PNP transistor having an emitter connected to said fifth potential, a collector connected to the collector of said sixth NPN transistor, and a base connected to the collector of said sixth NPN transistor; and an eighth PNP transistor having an emitter connected to said fifth potential, a base connected to the base of said seventh PNP transistor, and a collector, and wherein said sixth current mirror circuit includes:

a seventh NPN transistor having an emitter connected to said sixth potential, a collector connected to the collector of said sixth PNP transistor, and a base connected to the collector of said sixth PNP transistor; and an eighth NPN transistor having an emitter connected to said sixth potential, a base connected to the base of said seventh NPN transistor, and a collector connected to the collector of said eighth PNP transistor.

18. A polarity detector comprising:

a first input terminal connected to a first transmission path;

a second input terminal connected to a second transmission path;

a first voltage-to-current converter connected to said first input terminal for feeding a current according to a potential at said first input terminal;

a second voltage-to-current converter connected to said second input terminal for feeding a current according to a potential at said second input terminal;

voltage generator means receiving the currents from said first and second voltage-to-current converters for generating a voltage according to a potential difference between said first and second input terminals based on a voltage intermediate a first reference voltage and a second reference voltage different from said first reference voltage; and a discriminating circuit for determining a magnitude relationship between the voltage provided by said voltage generator means and said first and second reference voltages to output the discrimination result.

19. The polarity detector of claim 18, wherein said voltage generator means includes:

adder means connected to said first and second voltage-to-current converters and receiving the currents fed by said first and second voltage-to-current converters for performing addition or subtraction between the currents to output a current according to the potential difference between said first and second input terminals; and current-to-voltage converter means connected to said adder means for converting the current fed by said adder means into a voltage to output the voltage, and said discriminating circuit includes:

a first comparing portion having a first input end receiving said first reference voltage, a second input end receiving the voltage provided by said current-to-voltage converter means, and an output end for making voltage comparison between said first and second input ends; and a second comparing portion having a first input end receiving said second reference voltage, a second input end receiving the voltage provided by said current-to-voltage converter means, and an output end for making voltage comparison between said first and second inputs.

20. The polarity detector of claim 19, wherein said first comparing portion includes:

a first comparator connected to the first input end having a non-inverting input end receiving said first reference voltage, an inverting input end receiving the voltage provided by said current-to-voltage converter means, and an output end for outputting a first signal level at said output end when a potential difference between said non-inverting input end and said inverting input end is more than 0 V on the basis of the potential at said inverting input end, and for outputting a second signal level at said output end when said potential difference is less than 0 V, and wherein said second comparing portion includes a second comparator connected to the second input end having an inverting input end receiving said second reference voltage, a non-inverting input end receiving the voltage provided by said current-to-voltage converter means, and an output end for outputting a first signal level at said output end when a potential difference between said non-inverting input end and said inverting input end is more than 0 V on the basis of the potential at said inverting input end, and for outputting a second signal level at said output end when said potential difference is less than 0 V.

21. The polarity detector of claim 20, wherein said first comparator includes:

a first PNP transistor having a base connected to the non-inverting input end of said first comparator, a collector connected to a third potential, and an emitter;

a second PNP transistor having a base connected to the inverting input end of said first comparator, a collector connected to said third potential, and an emitter;

a third PNP transistor having a base connected to the emitter of said first PNP transistor, an emitter and a collector a fourth PNP transistor having a base connected to the emitter of said second PNP transistor, an emitter connected to the emitter of said third PNP transistor, and a collector;

a first constant current source having a first end connected to a fourth potential, and a second end connected to the emitters of said third and fourth PNP transistors for feeding a predetermined constant current to the emitters of said third and fourth PNP transistors from said fourth potential;

a first NPN transistor having a collector connected to the collector of said third PNP transistor, a base connected to the collector of said third PNP transistor, and an emitter connected to said third potential;

a second NPN transistor having a collector connected to the collector of said fourth PNP transistor, a base connected to the base of said first NPN transistor, and an emitter connected to said third potential;

a third NPN transistor having a base connected to the collector of said second NPN transistor, an emitter connected to said third potential, and a collector;

a second constant current source having a first end connected to said fourth potential and a second end connected to the collector of said third NPN transistor for feeding a predetermined constant current to the emitter of said third NPN transistor from said fourth potential;

a fourth NPN transistor having a base connected to the collector of said third NPN transistor, an emitter connected to said third potential, and a collector; and first resistor means having a first end connected to said fourth potential, and a second end connected to the collector of said fourth NPN transistor and the output end of said first comparator, and wherein said second comparator includes:

a fifth PNP transistor having a base connected to the non-inverting input end of said second comparator, a collector connected to said third potential, and an emitter;

a sixth PNP transistor having a base connected to the inverting input end of said second comparator, a collector connected to said third potential, and an emitter;

a seventh PNP transistor having a base connected to the emitter of said fifth PNP transistor, an emitter, and a collector;

an eighth PNP transistor having a base connected to the emitter of said sixth PNP transistor, an emitter connected to the emitter of said seventh PNP transistor, and a collector;

a third constant current source having a first end connected to said fourth potential and a second end connected to the emitters of said seventh and eighth PNP transistors for feeding a predetermined constant current to the emitters of said seventh and eighth PNP transistors from said fourth potential;

a fifth NPN transistor having a collector connected to the collector of said seventh PNP transistor, a base connected to the collector of said seventh PNP transistor, and an emitter connected to said third potential;

a sixth NPN transistor having a collector connected to the collector of said eighth PNP transistor, a based connected to the base of said fifth NPN transistor, and an emitter connected to said third potential;

a seventh NPN transistor having a base connected to the collector of said sixth NPN transistor, an emitter connected to said third potential, and a collector;

a fourth constant current source having a first end connected to said fourth potential and a second end connected to the collector of said seventh NPN transistor for feeding a predetermined constant current to the emitter of said seventh NPN transistor from said fourth potential;

an eighth NPN transistor having a base connected to the collector of said seventh NPN transistor, an emitter connected to said third potential, and a collector, and second resistor means having a first end connected to said fourth potential, and a second end connected to the collector of said eighth NPN transistor and the output end of said second comparator.

22. The polarity detector of claim 19, further comprising:

a reference voltage generator connected to the first input end of said first comparator and to the second input end of said second comparator for generating said first and second reference voltages to apply said reference voltages to said first and second comparators.

23. The polarity detector of claim 22, wherein said reference voltage generator generates said first and second reference voltages and a third reference voltage intermediate said first and second reference voltages to output said third reference voltage to said current-to-voltage converter means.

24. The polarity detector of claim 23, wherein said reference voltage generator includes:

first diode means having a cathode connected to a third potential, and an anode;

first resistor means having a first end connected to the anode of said first diode means and a second end;

second diode means having a cathode connected to the second end of said first resistor means and an anode;

second resistor means having a first end connected to a fourth potential higher than said third potential, and a second end connected to the anode of said second diode means;

third resistor means having a first end connected to said fourth potential, and a second end;

fourth resistor means having a first end connected to the second end of said third resistor means, and a second end connected to the first end of said first resistor means;

a first NPN transistor having a collector connected to said fourth potential, a base connected to the second end of said second resistor means, and an emitter; and fifth resistor means having a first end connected to the emitter of said first NPN transistor, and a second end connected to said third potential, said second reference voltage being provided from the anode of said first diode means, said first reference voltage being provided from the second end of said third resistor means, and said third reference voltage being provided from the emitter of said first NPN transistor.

25. The polarity detector of claim 22, wherein said current-to-voltage converter means converts the current fed by said adder means into a first voltage based on a second voltage intermediate said first and second reference voltages to output a voltage.

26. The polarity detector of claim 25, wherein said current-to-voltage converter means includes
  voltage drop means having a first end receiving the current fed by said adder means and a second end receiving said intermediate voltage, and
  wherein a voltage across said voltage drop means is generated in the form of said output voltage of said current-to-voltage converter means.
27. The polarity detector of claim 26, wherein:
said voltage drop means includes:
  a resistor coupled between said first and second ends of said converter means.
28. The polarity detector of claim 18, wherein
said first input terminal is connected to said first transmission path through first resistor means, and
said second input terminal is connected to said second transmission path through second resistor means.

* * * * *